(12) United States Patent
Obu et al.

(10) Patent No.: US 11,658,180 B2
(45) Date of Patent: May 23, 2023

(54) SEMICONDUCTOR DEVICE HAVING A PLURALITY OF BIPOLAR TRANSISTORS WITH DIFFERENT HEIGHTS BETWEEN THEIR RESPECTIVE EMITTER LAYERS AND EMITTER ELECTRODES

(71) Applicant: Murata Manufacturing Co., Ltd., Kyoto-fu (JP)

(72) Inventors: Isao Obu, Nagaokakyo (JP); Shigeki Koya, Nagaokakyo (JP); Yasunari Umemoto, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 148 days.

(21) Appl. No.: 17/188,961

(22) Filed: Mar. 1, 2021

(65) Prior Publication Data
US 2021/0183854 A1  Jun. 17, 2021

Related U.S. Application Data

(63) Continuation of application No. 16/440,700, filed on Jun. 13, 2019, now Pat. No. 10,964,693.

(30) Foreign Application Priority Data

Jul. 19, 2018  (JP) .............................. JP2018-136042

(51) Int. Cl.
  *H01L 27/082*  (2006.01)
  *H01L 23/00*  (2006.01)
  (Continued)

(52) U.S. Cl.
  CPC ...... *H01L 27/0823* (2013.01); *H01L 21/8252* (2013.01); *H01L 23/49827* (2013.01);
  (Continued)

(58) Field of Classification Search
  CPC ............. H01L 27/0823; H01L 27/0755; H01L 27/082; H01L 21/8252; H01L 23/49827;
  (Continued)

(56) References Cited

U.S. PATENT DOCUMENTS 5,734,193 A  3/1998 Bayraktaroglu et al.
6,403,436 B1  6/2002 Tanomura
(Continued)

FOREIGN PATENT DOCUMENTS

JP  2017-220584 A  12/2017
TW     201442229 A  11/2014

*Primary Examiner* — Kyoung Lee
*Assistant Examiner* — Christina A Sylvia
(74) *Attorney, Agent, or Firm* — Studebaker & Brackett PC

(57) ABSTRACT

A semiconductor device has a semiconductor substrate, and multiple first bipolar transistors on the first primary surface side of the semiconductor substrate. The first bipolar transistors have a first height between an emitter layer and an emitter electrode in the direction perpendicular to the first primary surface. The semiconductor device further has at least one second bipolar transistor on the first primary surface side of the semiconductor substrate. The second bipolar transistor have a second height, greater than the first height, between an emitter layer and an emitter electrode in the direction perpendicular to the first primary surface. Also, the semiconductor has a first bump stretching over the multiple first bipolar transistors and the at least one second bipolar transistor.

18 Claims, 21 Drawing Sheets

(51) Int. Cl.
*H01L 29/205* (2006.01)
*H01L 29/73* (2006.01)
*H01L 29/737* (2006.01)
*H01L 29/66* (2006.01)
*H01L 23/498* (2006.01)
*H01L 21/8252* (2006.01)
*H03F 3/20* (2006.01)
*H03F 1/56* (2006.01)

(52) U.S. Cl.
CPC ........ *H01L 23/49844* (2013.01); *H01L 24/11* (2013.01); *H01L 24/13* (2013.01); *H01L 24/16* (2013.01); *H01L 24/81* (2013.01); *H01L 29/205* (2013.01); *H01L 29/66318* (2013.01); *H01L 29/7304* (2013.01); *H01L 29/7371* (2013.01); *H01L 2223/6655* (2013.01); *H01L 2224/11462* (2013.01); *H01L 2224/13019* (2013.01); *H01L 2224/13025* (2013.01); *H01L 2224/13082* (2013.01); *H01L 2224/13144* (2013.01); *H01L 2224/13147* (2013.01); *H01L 2224/13166* (2013.01); *H01L 2224/16227* (2013.01); *H01L 2224/81815* (2013.01); *H03F 1/56* (2013.01); *H03F 3/20* (2013.01); *H03F 2200/222* (2013.01); *H03F 2200/318* (2013.01); *H03F 2200/387* (2013.01)

(58) Field of Classification Search
CPC ... H01L 23/49844; H01L 23/03; H01L 23/05; H01L 23/14; H01L 23/06; H01L 24/11; H01L 24/13; H01L 24/16; H01L 24/81; H01L 29/205; H01L 29/66318; H01L 29/7304; H01L 29/7371; H01L 29/401; H01L 29/0817; H01L 29/402; H01L 29/41708; H01L 29/66242; H01L 29/737; H01L 2223/6655; H01L 2224/11462; H01L 2224/13019; H01L 2224/1302; H01L 2224/13082; H01L 2224/13144; H01L 2224/13147; H01L 2224/13166; H01L 2224/16227; H01L 2224/81815; H01L 2224/0345; H01L 2224/0361; H01L 2224/03912; H01L 2224/0401; H01L 2224/05018; H01L 2224/05073; H01L 2224/05166; H01L 2224/05558; H01L 2224/05647; H01L 2224/06051; H01L 2224/06102; H01L 2224/1147; H01L 2224/14051; H03F 1/56; H03F 3/20; H03F 3/213; H03F 2200/222; H03F 2200/318; H03F 2200/387
See application file for complete search history.

(56) References Cited

U.S. PATENT DOCUMENTS

2005/0156194 A1* 7/2005 Ohbu ................. H01L 27/0605
                                                257/E29.189
2007/0287234 A1   12/2007 Kang et al.
2014/0312390 A1   10/2014 Tsai et al.
2017/0236925 A1*  8/2017 Zampardi ......... H01L 29/66242
                                                257/197
2017/0359030 A1*  12/2017 Obu ....................... H03F 3/213
2020/0303372 A1*  9/2020 Sasaki ................... H03F 3/213

* cited by examiner

SEMICONDUCTOR DEVICE HAVING A PLURALITY OF BIPOLAR TRANSISTORS WITH DIFFERENT HEIGHTS BETWEEN THEIR RESPECTIVE EMITTER LAYERS AND EMITTER ELECTRODES

CROSS-REFERENCE TO RELATED APPLICATION

This application is a Continuation of U.S. patent application Ser. No. 16/440,700 filed Jun. 13, 2019, which claims benefit of priority to Japanese Patent Application No. 2018-136042, filed Jul. 19, 2018, the entire content of which is incorporated herein by reference.

BACKGROUND

Technical Field

The present disclosure relates to a semiconductor device.

Background Art

Japanese Unexamined Patent Application Publication No. 2017-220584 describes a semiconductor device that has first and second bipolar transistors on the same semiconductor substrate. The multiple unit transistors forming the first bipolar transistor have no emitter ballast resistor layer. The multiple unit transistors forming the second bipolar transistor have an emitter ballast resistor layer.

The semiconductor device described in Japanese Unexamined Patent Application Publication No. 2017-220584 has the emitter wiring (top surface of the emitter electrode) of its first bipolar transistor and that of its second bipolar transistor at different heights from the bottom surface of the semiconductor substrate. Forming a bump on each of the first and second bipolar transistors and mounting the semiconductor device on a module substrate with the bumps interposed therebetween can therefore cause poor connection.

SUMMARY

Accordingly, the present disclosure provides a semiconductor device that can be mounted on an external substrate with reduced occurrence of poor electrical connection.

According to preferred embodiments of the present disclosure, a semiconductor device has a semiconductor substrate; and a plurality of first bipolar transistors on a first primary surface side of the semiconductor substrate. The first bipolar transistors have a first height between an emitter layer and an emitter electrode in the direction perpendicular to the first primary surface. The semiconductor device further has at least one second bipolar transistor on the first primary surface side of the semiconductor substrate. The second bipolar transistor have a second height, greater than the first height, between an emitter layer and an emitter electrode in the direction perpendicular to the first primary surface. Also, the semiconductor device has a first bump stretching over the plurality of first bipolar transistors and the at least one second bipolar transistor.

The semiconductor device according to preferred embodiments of the present disclosure can be mounted on an external substrate with reduced occurrence of poor electrical connection.

Other features, elements, characteristics and advantages of the present disclosure will become more apparent from the following detailed description of preferred embodiments of the present disclosure with reference to the attached drawings.

DETAILED DESCRIPTION

The following describes semiconductor devices according to embodiments of the present disclosure in detail with reference to the drawings. It should be noted that no aspect of the present disclosure is limited to these embodiments. Needless to say, the embodiments presented hereinafter are illustrative, and partial replacement or combination of configurations described in different embodiments is possible. The second and later embodiments skip over anything in common with Embodiment 1 and describe only differences. In particular, similar advantages resulting from similar configurations are not mentioned one by one in each embodiment.

Embodiment 1

Figure 1:
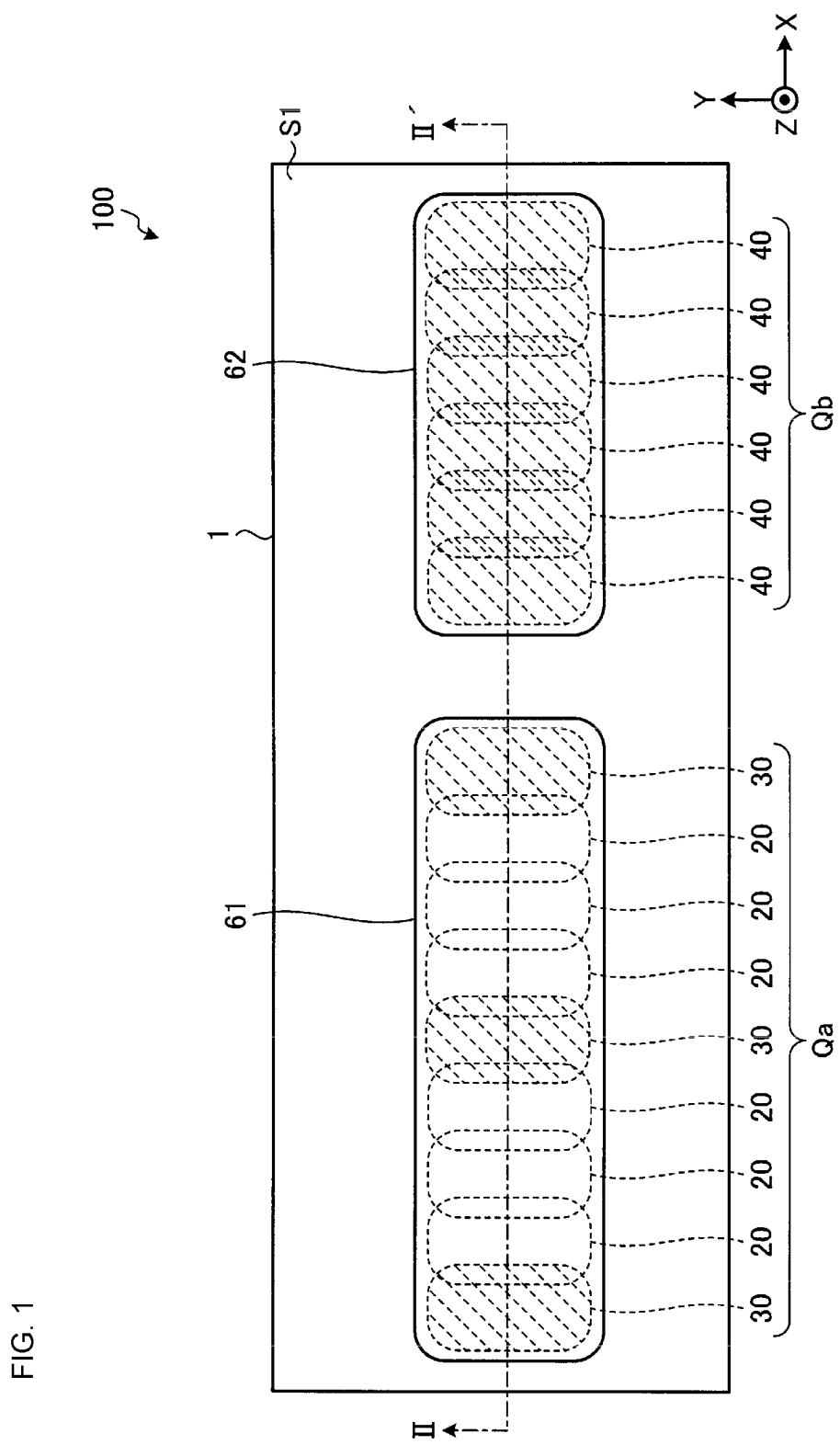
FIG. 1 is a plan view of a semiconductor device according to Embodiment 1.
Figure 2:
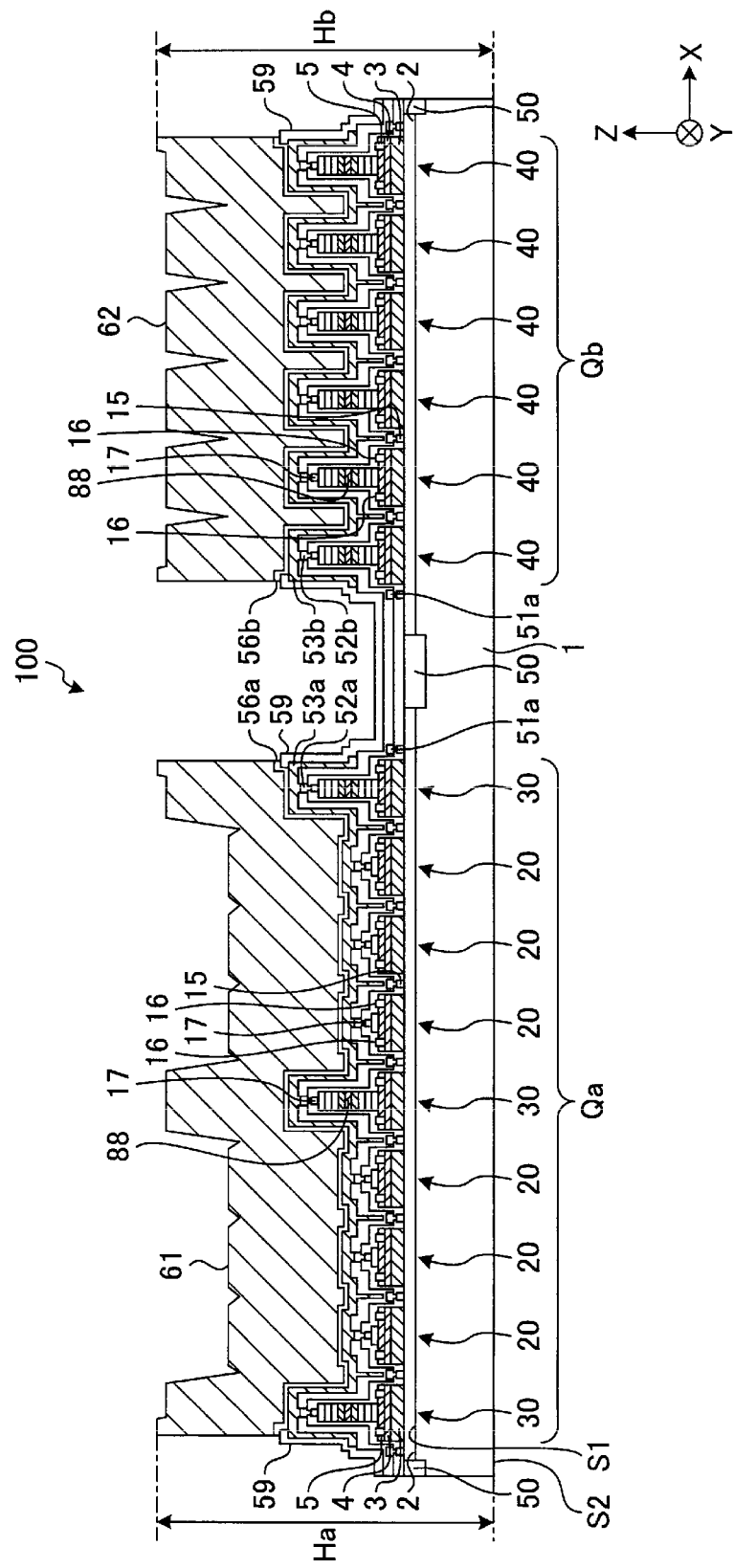
FIG. 2 is a cross-section along line II-II' in FIG. 1.
Figure 3:
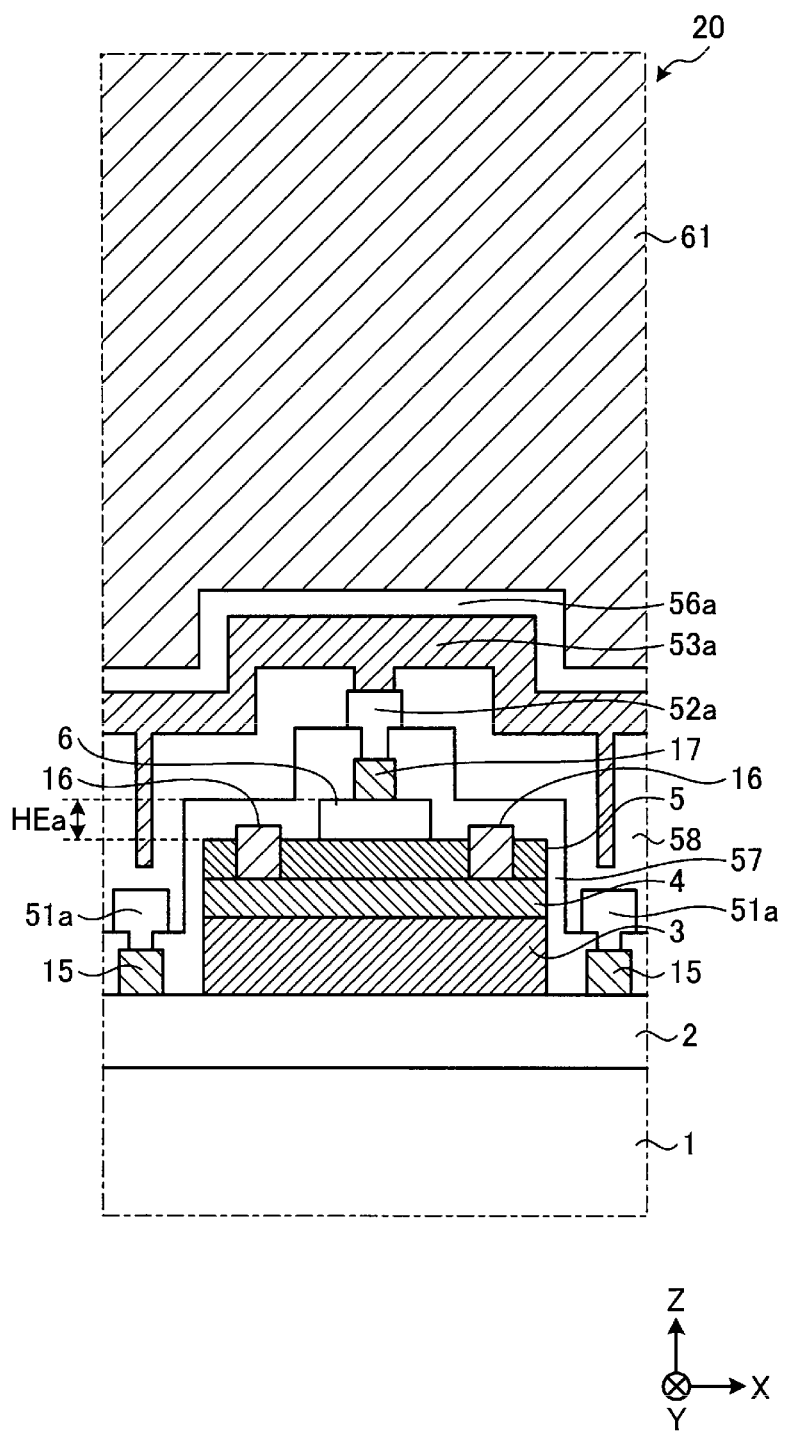
FIG. 3 is a cross-section of a first bipolar transistor.
Figure 4:
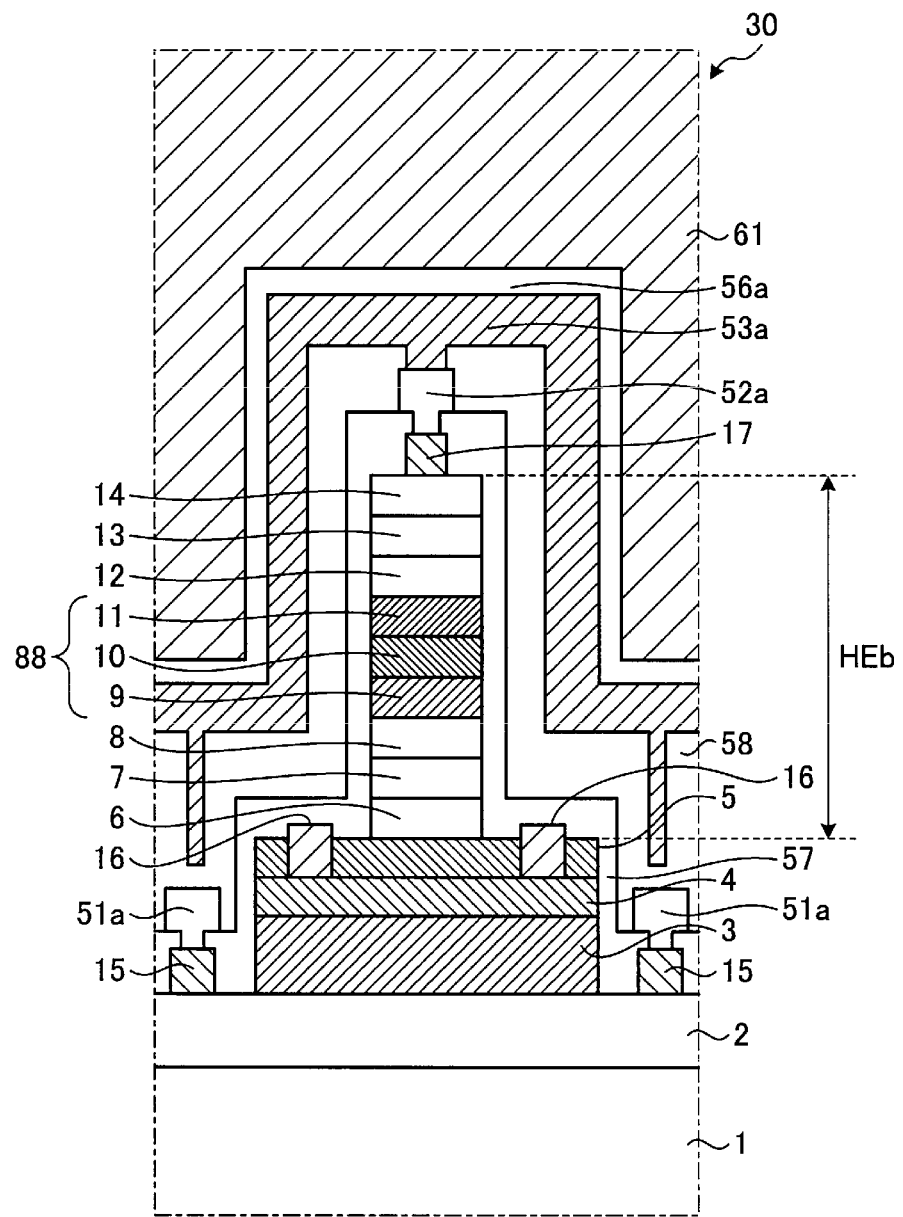
FIG. 4 is a cross-section of a second bipolar transistor.
Figure 4:
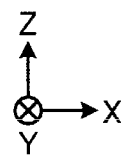
Figure 5:
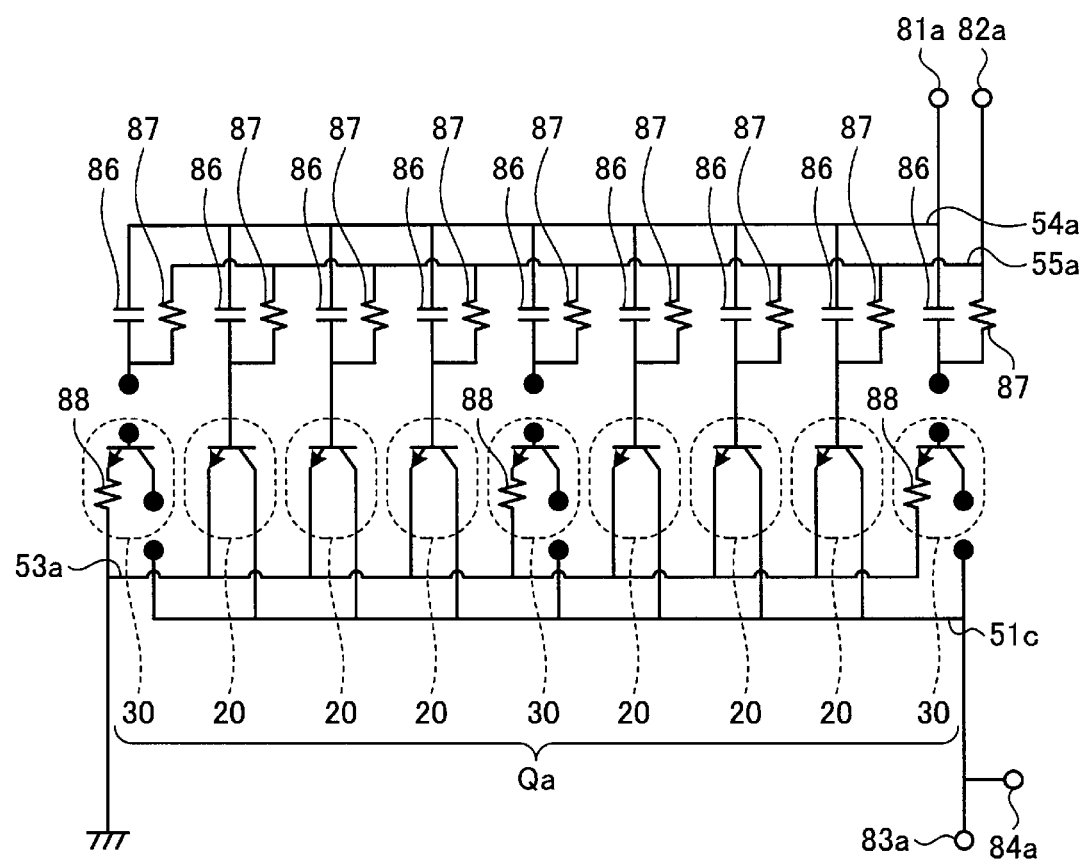
FIG. 5 is an equivalent circuit diagram of a first transistor assembly.
Figure 6:
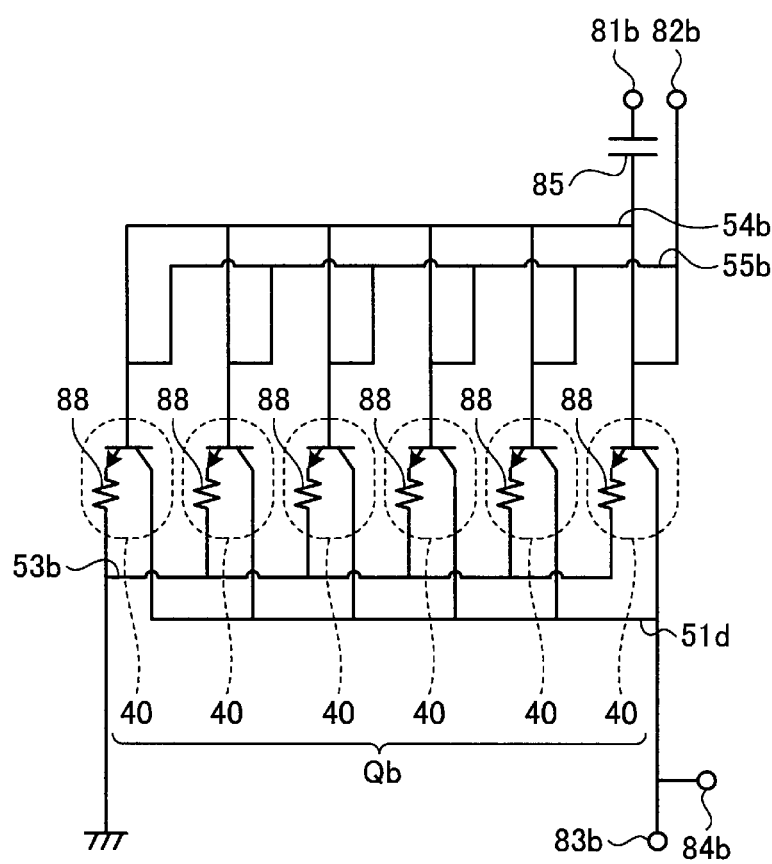
FIG. 6 is an equivalent circuit diagram of a second transistor assembly.

FIG. 1 is a plan view of a semiconductor device according to Embodiment 1. FIG. 2 is a cross-section along line II-II' in FIG. 1. FIG. 3 is a cross-section of a first bipolar transistor. FIG. 4 is a cross-section of a second bipolar transistor. FIG. 5 is an equivalent circuit diagram of a first transistor assembly. FIG. 6 is an equivalent circuit diagram of a second transistor assembly. It is to be understood that FIG. 1 is a schematic representation of the configuration of the bipolar transistors and does not illustrate the detailed structure of each bipolar transistor.

As illustrated in FIG. 1, the semiconductor device 100 has a semiconductor substrate 1, a first transistor assembly Qa, a second transistor assembly Qb, a first bump 61, and a second bump 62.

In the following description, a direction in the plane parallel to the first primary surface S1 of the semiconductor substrate 1 is defined as X direction. The direction perpendicular to X direction in the plane parallel to the first primary surface S1 is defined as Y direction. The direction perpendicular to each of X and Y directions is defined as Z direction. This is not the only possible setting, and Y direction may intersect X direction at an angle other than 90°. Z direction may intersect X and Y directions at an angle other than 90°.

As illustrated in FIG. 1, the semiconductor substrate 1 is substantially rectangular in plan view, or when viewed in Z direction. As illustrated in FIG. 2, the semiconductor substrate 1 has a first primary surface S1 and a second primary surface S2 opposite the first primary surface S1. The longitudinal axis of the semiconductor substrate 1 extends along X direction, the transverse axis extends along Y direction, and the direction perpendicular to the first primary surface S1 is Z direction. The semiconductor substrate 1 is made of, for example, semi-insulating gallium arsenide (GaAs).

As illustrated in FIGS. 1 and 2, the first and second transistor assemblies Qa and Qb are on the first primary surface S1 side of the semiconductor substrate 1. The first and second transistor assemblies Qa and Qb are beside each other with a space therebetween in X direction. The first transistor assembly Qa has multiple first bipolar transistors 20 and multiple second bipolar transistors 30. The second transistor assembly Qb has multiple third bipolar transistors 40. That is, there are multiple first bipolar transistors 20, multiple second bipolar transistors 30, and multiple third bipolar transistors 40 on the first primary surface S1 side of the semiconductor substrate 1.

Each of the first, second, and third bipolar transistors 20, 30, and 40 is a heterojunction bipolar transistor (HBT). In FIG. 1, the second and third bipolar transistors 30 and 40 are shaded so that they can be distinguished from the first bipolar transistors 20.

Each of the first, second, and third bipolar transistors 20, 30, and 40 is also referred to as a unit transistor. The first bipolar transistors 20 are electrically connected in parallel to form the first transistor assembly Qa. At least one of the collector and base of the second bipolar transistors 30 is isolated from the first bipolar transistors 20, preventing the second bipolar transistors 30 from functioning as transistors. The multiple third bipolar transistors 40 are electrically connected in parallel to form the second transistor assembly Qb. A unit transistor is defined as a smallest transistor in the first or second transistor assembly Qa or Qb.

In this embodiment, the first transistor assembly Qa has six first bipolar transistors 20 and three second bipolar transistors 30 by way of example. In the first transistor assembly Qa, the three second bipolar transistors 30 are at the end and middle portions in X direction, spaced apart from each other. The multiple first bipolar transistors 20 are interposed between second bipolar transistors 30 adjacent in X direction. This is not the only possible configuration, and the number and configuration of the first and second bipolar transistors 20 and 30 may be changed as necessary. For example, the first transistor assembly Qa may have one second bipolar transistor 30.

In this embodiment, the second transistor assembly Qb has six third bipolar transistors 40. In the second transistor assembly Qb, the multiple third bipolar transistors 40 are lined up in X direction. This is not the only possible configuration, and the number and configuration of the third bipolar transistors 40 may be changed as necessary.

The first bump 61 stretches over the multiple first bipolar transistors 20 and the multiple second bipolar transistors 30. The second bump 62 stretches over the multiple third bipolar transistors 40.

As illustrated in FIG. 2, there is an isolation region 50 in the semiconductor substrate 1 and a subcollector layer 2 between the first and second transistor assemblies Qa and Qb. The isolation region 50 is a region created by electrically insulating part of the semiconductor substrate 1 and subcollector layer 2 by ion implantation. The isolation region 50 electrically isolates the first and second transistor assemblies Qa and Qb from each other.

The first bipolar transistors 20 are transistors having no emitter ballast resistor 88. The second and third bipolar transistors 30 and 40 are transistors having an emitter ballast resistor 88.

Specifically, a first bipolar transistor 20 includes, as illustrated in FIG. 3, a subcollector layer 2, a collector layer 3, a base layer 4, an emitter layer 5, a first contact layer 6, and electrodes and wiring. The subcollector layer 2, collector layer 3, base layer 4, emitter layer 5, and first contact layer 6 are stacked in this order on the semiconductor substrate 1.

The subcollector layer 2 is on the first primary surface S1 of the semiconductor substrate 1. The collector layer 3 is on the subcollector layer 2. The subcollector layer 2 functions as the collector of the first bipolar transistor 20 together with the collector layer 3. The subcollector and collector layers 2 and 3 are, for example, GaAs-based n-type semiconductors. The subcollector layer 2 can be doped with S1 at a concentration of about $5 \times 10^{18}$ cm$^{-3}$ and can be about 600 nm thick. The collector layer 3 can be doped with Si at a concentration of about $1 \times 10^{16}$ cm$^{-3}$ and can be about 1000 nm thick.

The base layer 4 is on the collector layer 3. The base layer 4 is, for example, a GaAs-based p-type semiconductor. The base layer 4 can be doped with C at a concentration of about $5 \times 10^{19}$ cm$^{-3}$ and can be about 96 nm thick.

The emitter layer 5 is on the base layer 4. The emitter layer 5 is, for example, an InGaP-based n-type semiconductor. The emitter layer 5 can have an InP molar fraction of about 0.48, can be doped with Si at a concentration of about $4 \times 10^{17}$ cm$^3$, and can be about 35 nm thick.

The first contact layer 6 is on the emitter layer 5. The first contact layer 6 is, for example, a GaAs-based n-type semiconductor. The first contact layer 6 can be doped with Si at a concentration of about $5 \times 10^{18}$ cm$^{-3}$ and can be about 50 nm thick.

There are two collector electrodes 15 on the subcollector layer 2, with the collector layer 3 therebetween in X direction. The collector electrodes 15 are AuGe (about 60 nm thick)/Ni (about 10 nm thick)/Au (about 200 nm thick). The symbol "I" represents a layered structure. For example, AuGe/Ni/Au represents a structure in which a layer of Ni is on a layer of AuGe, and a layer of Au is on the layer of Ni.

In this embodiment, the collector electrodes 15 are shared by adjacent first bipolar transistors 20. That is, as illustrated in FIG. 2, there is one collector electrode 15 between two adjacent first bipolar transistors 20. The one collector electrode 15 is electrically coupled to each of the adjacent first bipolar transistors 20. This allows the first transistor assembly Qa to be made with fewer electrodes and less wiring than when using two collector electrodes 15 per first bipolar transistor 20.

As illustrated in FIG. 3, there are two base electrodes 16 on the base layer 4. In plan view, the first contact layer 6 is between the two base electrodes 16. The base electrodes 16 are, for example, Pt (about 20 nm thick)/Ti (about 50 nm thick)/Pt (about 50 nm thick)/Au (about 200 nm thick).

On the first contact layer 6 is an emitter electrode 17. The emitter electrode 17 is, for example, Mo (about 10 nm thick)/Ti (about 5 nm thick)/Pt (about 30 nm thick)/Au (about 200 nm thick).

A protective layer 57 covers the subcollector layer 2, collector layer 3, base layer 4, emitter layer 5, first contact layer 6, and electrodes. On the protective layer 57 are collector connection wiring 51a and emitter connection wiring 52a. The collector connection wiring 51a is connected to the collector electrodes 15 via through holes created in the protective layer 57. The emitter connection wiring 52a is connected to the emitter electrode 17 via a through hole created in the protective layer 57.

On the protective film 57 is an interlayer insulating film 58, covering the collector and emitter connection wiring 51a and 52a. On the interlayer insulating film 58 is first emitter wiring 53a. The first emitter wiring 53a is connected to the emitter connection wiring 52a via a through hole created in the interlayer insulating film 58. As a result, the first emitter wiring 53a is electrically coupled to the emitter electrode 17 via the emitter connection wiring 52a.

The protective film 57 and interlayer insulating film 58 are, for example, SiN. The collector connection wiring 51a, emitter connection wiring 52a, and first emitter wiring 53a are, for example, Au.

The first bump 61 is on the first emitter wiring 53a with a lower metal layer 56a interposed therebetween. The first bump 61 is a Cu pillar bump and is formed by electroplating. The first bump 61 may be made from another metal material, such as Au. The lower metal layer 56a is, for example, Ti/Cu and, in the formation of the first bump 61, serves as a seed metal for plating.

FIG. 4 illustrates the layer structure of a second bipolar transistor 30. The third bipolar transistors 40 have the same layer structure as the second bipolar transistors 30. Thus the description of the layer structure of a second bipolar transistor 30 also applies to the third bipolar transistors 40.

As illustrated in FIG. 4, a second bipolar transistor 30 has a subcollector layer 2, a collector layer 3, a base layer 4, an emitter layer 5, a first contact layer 6, collector electrodes 15, base electrodes 16, and collector connection wiring 51a on the first primary surface S1 of the semiconductor substrate 1 like a first bipolar transistor 20. Between the first contact layer 6 and the emitter electrode 17 are a tunnel barrier layer 7, a spacer layer 8, an emitter ballast resistor 88, a second contact layer 12, a third contact layer 13, and a fourth contact layer 14 stacked in this order.

The tunnel barrier layer 7 is on the first contact layer 6. The tunnel barrier layer 7 is, for example, an InGaP-based n-type semiconductor. The tunnel barrier layer 7 can have an InP molar fraction of about 0.48, can be doped with Si at a concentration of about $5 \times 10^{18}$ cm$^{-3}$, and can be about 3 nm thick.

The spacer layer 8 is on the tunnel barrier layer 7. The spacer layer 8 is, for example, a GaAs-based n-type semiconductor. The spacer layer 8 can be doped with Si at a concentration of about $3 \times 10^{17}$ cm$^{-3}$ and can be about 100 nm thick.

The emitter ballast resistor 88 has a first emitter ballast resistor layer 9, a second emitter ballast resistor layer 10, and a third emitter ballast resistor layer 11. The first, second, and third emitter ballast resistor layers 9, 10, and 11 are stacked in this order on the spacer layer 8. Each of the first, second, and third emitter ballast resistor layers 9, 10, and 11 is an AlGaAs-based n-type semiconductor.

The first emitter ballast resistor layer 9 can be doped with Si at a concentration of about $1 \times 10^{17}$ cm$^{-3}$ and can be about 50 nm thick. The molar fraction of AlAs in the first emitter ballast resistor layer 9 increases toward the second emitter ballast resistor layer 10. Specifically, the molar fraction of AlAs is about 0 at the interface where the first emitter ballast resistor layer 9 touches the spacer layer 8, and is about 0.33 at the interface where the first emitter ballast resistor layer 9 touches the second emitter ballast resistor layer 10. The first emitter ballast resistor layer 9 is formed so that the molar fraction of AlAs therein changes linearly.

The second emitter ballast resistor layer 10 can have an AlAs molar fraction of about 0.33, can be doped with Si at a concentration of about $1 \times 10^{17}$ cm$^3$, and can be about 200 nm thick.

The third emitter ballast resistor layer 11 can be doped with Si at a concentration of about $1 \times 10^{17}$ cm$^{-3}$ and can be about 50 nm thick. The molar fraction of AlAs in the third emitter ballast resistor layer 11 decreases toward the second contact layer 12. Specifically, the molar fraction of AlAs is about 0.33 at the interface where the third emitter ballast resistor layer 11 touches the second emitter ballast resistor layer 10, and is about 0 at the interface where the third emitter ballast resistor layer 11 touches the second contact layer 12. The third emitter ballast resistor layer 11 is formed so that the molar fraction of AlAs therein changes linearly. The emitter ballast resistor 88 has a higher resistivity than the first contact layer 6. It is not essential that the emitter ballast resistor 88 be composed of three layers. For example, the entire emitter ballast resistor 88 may be the one layer of the second emitter ballast resistor layer 10.

The second, third, and fourth contact layers 12, 13, and 14 are stacked in this order on the third emitter ballast resistor layer 11. The second contact layer 12 is, for example, a GaAs-based n-type semiconductor. The second contact layer 12 can be doped with Si at a concentration of about $5 \times 10^{18}$ cm$^{-3}$ and can be about 50 nm thick.

The third contact layer 13 is, for example, an InGaAs-based n-type semiconductor. The third contact layer 13 can be doped with Si at a concentration of about $5 \times 10^{18}$ cm$^3$ and can be about 50 nm thick. The molar fraction of InAs in the third contact layer 13 increases toward the fourth contact layer 14. Specifically, the molar fraction of InAs is about 0 at the interface where the third contact layer 13 touches the second contact layer 12, and is about 0.5 at the interface where the third contact layer 13 touches the fourth contact layer 14. The third contact layer 13 is formed so that the molar fraction of InAs therein changes linearly.

The fourth contact layer 14 is, for example, an InGaAs-based n-type semiconductor. The fourth contact layer 14 can have an InAs molar fraction of about 0.5, can be doped with Si at a concentration of about $1 \times 10^{19}$ cm$^{-3}$, and can be about 50 nm thick.

The emitter electrode 17 is on the fourth contact layer 14. The protective layer 57 covers the layers from the subcollector layer 2 to the fourth contact layer 14 and the collector electrodes 15, base electrodes 16, and emitter electrode 17.

In a second bipolar transistor 30, too, there is first emitter wiring 53a on an interlayer insulating film 58 as in a first bipolar transistor 20. The first emitter wiring 53a is connected to emitter connection wiring 52a via a through hole created in the interlayer insulating film 58. As a result, the first emitter wiring 53a is electrically coupled to the emitter electrode 17 of the second bipolar transistor 30 via the emitter connection wiring 52a.

As illustrated in FIG. 3, in a first bipolar transistor 20, the distance in Z direction between the top surface of the emitter layer 5 and the bottom surface of the emitter electrode 17 is defined as a first height HEa. As illustrated in FIG. 4, in a second bipolar transistor 30, the distance in Z direction between the top surface of the emitter layer 5 and the bottom surface of the emitter electrode 17 is defined as a second height HEb. The second height HEb is greater than the first height HEa. The third bipolar transistors 40 also have the same second height HEb as the second bipolar transistors 30.

As illustrated in FIG. 2, in the first transistor assembly Qa, the multiple first bipolar transistors 20, having the first height HEa, and the multiple second bipolar transistors 30, having the second height HEb, are lined up in X direction. The first emitter wiring 53a stretches over the multiple first and multiple second bipolar transistors 20 and 30 and is electrically coupled to their respective emitter electrodes 17.

The first bump 61 stretches over the multiple first and multiple second bipolar transistors 20 and 30 above the first emitter wiring 53a. The first bump 61 extends along the first emitter wiring 53a and has irregularities corresponding to the height difference between the multiple first bipolar transistors 20 and the multiple second bipolar transistors 30.

Here, the distance in Z direction between the second primary surface S2 and the highest surface of the first bump 61 is defined as a first maximum height Ha. In this embodiment, a passivation film 59 covers the first transistor assembly Qa at least on its side surfaces, and the first bump 61 extends to a region where it overlaps part of the passivation film 59. In FIG. 2, the first maximum height Ha is the distance between the top surface of the portion of the first bump 61 that overlaps part of the passivation film 59 and the second primary surface S2. If the passivation film 59 is not higher than the first emitter wiring 53a, the first maximum height Ha is the distance between the top surface of the portion of the first bump 61 that overlaps the second bipolar transistors 30 and the second primary surface S2.

In the second transistor assembly Qb, the multiple third bipolar transistors 40, having the second height HEb, are lined up in X direction. The second emitter wiring 53b stretches over the multiple third bipolar transistors 40 and is electrically coupled to the emitter electrode 17 of the third bipolar transistors 40 via emitter connection wiring 52b.

The second bump 62 is above the second emitter wiring 53b with a lower metal layer 56b interposed therebetween and stretches over the multiple third bipolar transistors 40. The second bump 62 extends along the second emitter wiring 53b. The second bump 62 is a Cu pillar bump made with the same metal material as that for the first bump 61 and is formed by electroplating. The second bump 62 may be made from another metal material, such as Au.

Here, the distance in Z direction between the second primary surface S2 and the highest surface of the second bump 62 is defined as a second maximum height Hb. In this embodiment, a passivation film 59 covers the second transistor assembly Qb at least on its side surfaces, and the second bump 62 extends to a region where it overlaps part of the passivation film 59. In FIG. 2, the second maximum height Hb is the distance between the top surface of the portion of the second bump 62 that overlaps part of the passivation film 59 and the second primary surface S2. If the passivation film 59 is not higher than the second emitter wiring 53b, the second maximum height Hb is the distance between the top surface of the portion of the second bump 62 that overlaps the third bipolar transistors 40 and the second primary surface S2.

In this embodiment, the first maximum height Ha, of the first transistor assembly Qa, and the second maximum height Hb, of the second transistor assembly Qb, are substantially equal because the first transistor assembly Qa has multiple first bipolar transistors 20 and multiple second bipolar transistors 30. When the semiconductor device 100 is mounted on an external substrate with the first and second bumps 61 and 62 facing the external substrate, therefore, the first bump 61 is electrically coupled to the external substrate at least where it has the first maximum height Ha. That is, the first bump 61 is electrically coupled to the external substrate at least where it overlaps the second bipolar transistors 30. As a result, the first bipolar transistors 20, having the first height HEa, are electrically coupled to the external substrate via the first bump 61. In this way, the semiconductor device 100 can be mounted on an external substrate with less frequent occurrence of poor electrical connection than with a first transistor assembly Qa composed only of multiple first bipolar transistors 20 having the first height HEa.

As illustrated in FIG. 5, in the first transistor assembly Qa, each base (base electrodes 16) of the first bipolar transistors 20 is connected to shared first base wiring 54a via a capacitance 86. The first base wiring 54a is connected to a base high-frequency input terminal 81a. The capacitances 86 are capacitors for blocking the direct-current component. Each base (base electrodes 16) of the first bipolar transistors 20 is also connected to shared first base bias wiring 55a via a base ballast resistor 87. The first base bias wiring 55a is connected to a base bias terminal 82a. Each base of the second bipolar transistors 30 is isolated from the first base wiring 54a and first base bias wiring 55a.

Each emitter (emitter electrode 17) of the first bipolar transistors 20 and each emitter (emitter electrode 17) of the second bipolar transistors 30 are connected to shared first emitter wiring 53a and grounded.

Each collector (collector electrodes 15) of the first bipolar transistors 20 is connected to shared first collector wiring 51c. The first collector wiring 51c is connected to a collector high-frequency output terminal 83a and a collector bias terminal 84a. Each collector (collector electrodes 15) of the second bipolar transistors 30 is isolated from the first collector wiring 51c.

In such a configuration, the multiple first bipolar transistors 20 amplify a high-frequency signal input from the base high-frequency input terminal 81a and output the amplified signal to the collector high-frequency output terminal 83a. The second bipolar transistors 30, isolated from the base high-frequency input terminal 81a and collector high-frequency output terminal 83a, do not operate as transistors. In fact, the second bipolar transistors 30 only need to have at least one of their base and collector isolated from the first base wiring 54a or first collector wiring 51c. By virtue of being inoperative, the second bipolar transistors 30 produce no heat. By virtue of producing no heat, the second bipolar transistors 30 are used as spaces and therefore are expected to have the effect of dispersing localized heat. The localization of heat means that the difference S in heat is small between transistors in the middle and those at the ends. Alternatively, the second bipolar transistors 30 are expected to have the effect of reducing the thermal resistance of the first transistor assembly Qa by virtue of being inoperative.

As illustrated in FIG. 6, in the second transistor assembly Qb, each base (base electrodes 16) of the third bipolar transistors 40 is connected to shared second base wiring 54b. The second base wiring 54b is connected to a base high-frequency input terminal 81b via a capacitance 85. The capacitance 85 is a capacitor for blocking the direct-current component. Each base (base electrodes 16) of the third bipolar transistors 40 is also connected to shared second base bias wiring 55b. The second base wiring 55b is connected to a base bias terminal 82b.

Each emitter (emitter electrode 17) of the third bipolar transistors 40 is connected to shared second emitter wiring 53b and grounded. Each collector (collector electrodes 15) of the third bipolar transistors 40 is connected to shared second collector wiring 51d. The second collector wiring 51d is connected to a collector high-frequency output terminal 83b and a collector bias terminal 84b.

In such a configuration, the multiple third bipolar transistors 40 amplify a high-frequency signal input from the base high-frequency input terminal 81b and output the amplified signal to the collector high-frequency output terminal 83b.

By virtue of the overall structure set forth above, the semiconductor device 100 has, on a single semiconductor substrate 1, multiple first bipolar transistors 20 having no emitter ballast resistor 88 on their emitter layer 5 and multiple third bipolar transistors 40 having an emitter ballast resistor 88 on their emitter layer 5. The semiconductor device 100 operates with reduced breakdown of transistors and maintains their amplification characteristics by switching the transistors to operate (between the first and second transistor assemblies Qa and Qb) depending on the collector voltage. Specifically, the semiconductor device 100 can operate the first bipolar transistors 20, having no emitter ballast resistor 88, when the collector voltage is relatively low (e.g., about 6 V or less), or operate the third bipolar transistors 40, having an emitter ballast resistor 88, when the collector voltage is relatively high (e.g., about 6 V or more). As a result, the semiconductor device 100 achieves a high power-added efficiency whether the output power is low or high, and also more reliable than in the related art.

Moreover, placing the emitter ballast resistors 88 on the same semiconductor substrate 1 as the third bipolar transistors 40 reduces, compared with placing emitter ballast resistors outside of the semiconductor device 100, the occurrence of defects due to variations between the multiple third bipolar transistors 40, such as partial thermal runaway. Specifically, in the second transistor assembly Qb, the amount of flowing current is not constant across third bipolar transistors 40 and can concentrate at certain third bipolar transistors 40. In such a case, placing emitter ballast resistors outside the semiconductor device 100 only reduces the overall flow of current through the second transistor assembly Qb and is not effective in reducing the amount of current flowing through the certain third bipolar transistors 40. In this embodiment, by contrast, such local high currents at certain third bipolar transistors 40 are effectively prevented by virtue of each third bipolar transistor 40 having an emitter ballast resistor 88 inside the semiconductor device 100.

Production of the Semiconductor Device

Figure 7:
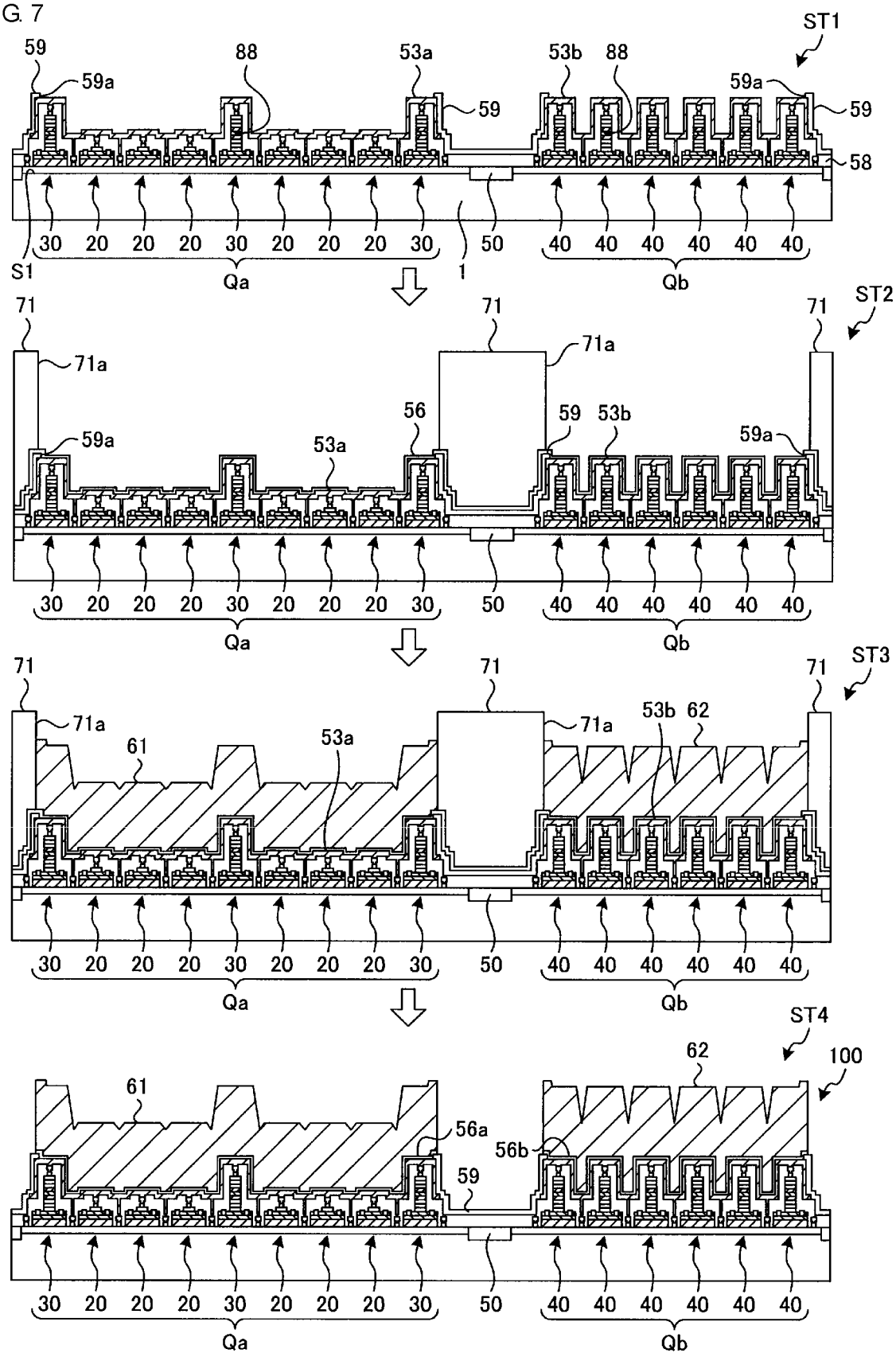
FIG. 7 presents diagrams for describing a method for producing a semiconductor device according to Embodiment 1.

FIG. 7 presents diagrams for describing a method for producing a semiconductor device according to Embodiment 1. As illustrated in FIG. 7, multiple first bipolar transistors 20, multiple second bipolar transistors 30, and multiple third bipolar transistors 40 are formed on the first primary surface 51 of a semiconductor substrate 1 (step ST1).

Japanese Unexamined Patent Application Publication No. 2017-220584 includes a detailed production method in which first bipolar transistors 20 having no emitter ballast resistor 88 and second and third bipolar transistors 30 and 40 having an emitter ballast resistor 88 are formed on the same semiconductor substrate 1. This embodiment therefore incorporates the relevant description in Japanese Unexamined Patent Application Publication No. 2017-220584 instead of describing a particular formation process.

A passivation film 59 is formed to stretch over the first and second transistor assemblies Qa and Qb, and openings 59a are created by photolithography and etching. The first emitter wiring 53a and second emitter wiring 53b are exposed through the openings 59a.

Then, a lower metal layer 56 and a resist 71 are formed (step ST2). The lower metal layer 56 is formed by, for example, sputtering. The lower metal layer 56 is formed on the surface of the first emitter wiring 53a and second emitter wiring 53b to cover the passivation film 59 and the openings 59a. The resist 71 is produced by forming a resist layer over the entire lower metal layer 56 and subsequent exposure and development using a photomask. As a result, the resist 71 is produced in a region where it overlaps the passivation film 59, and openings 71a are created in regions where they overlap the first emitter wiring 53a and second emitter wiring 53b.

Then, first and second bumps 61 and 62 are formed by electroplating (step ST3). The first bump 61 is formed above the first emitter wiring 53a to stretch over the multiple first and multiple second bipolar transistors 20 and 30. The second bump 62 is formed above the second emitter wiring 53b to stretch over the multiple third bipolar transistors 40. Since the first and second bumps 61 and 62 are formed in the same step, the height of the first bump 61 and that of the second bump 62 are substantially equal. The height of the first bump 61 is the distance in Z direction from the surface of the first emitter wiring 53a to the surface of the first bump 61. The height of the second bump 62 is the distance in Z direction from the surface of the second emitter wiring 53b to the surface of the second bump 62.

The portion of the first bump 61 formed above the first bipolar transistors 20 is substantially equal in height to the portion of the first bump 61 formed above the second bipolar transistors 30. Likewise, the portion of the first bump 61 formed above the second bipolar transistors 30 is substantially equal in height to the portion of the second bump 62 formed above the third bipolar transistors 40.

Then, the resist 71 is removed by etching, and the portion of the lower metal layer 56 not covered by the first or second bump 61 or 62 is removed by etching (step ST4). Through such a process, a semiconductor device 100 is formed with the first maximum height Ha, of the first transistor assembly Qa, substantially equal to the second maximum height Hb, of the second transistor assembly Qb. It should be understood that the production method illustrated in FIG. 7 is merely an example and is not the only method for producing the semiconductor device 100.

Variation 1 of Embodiment 1

Figure 8:
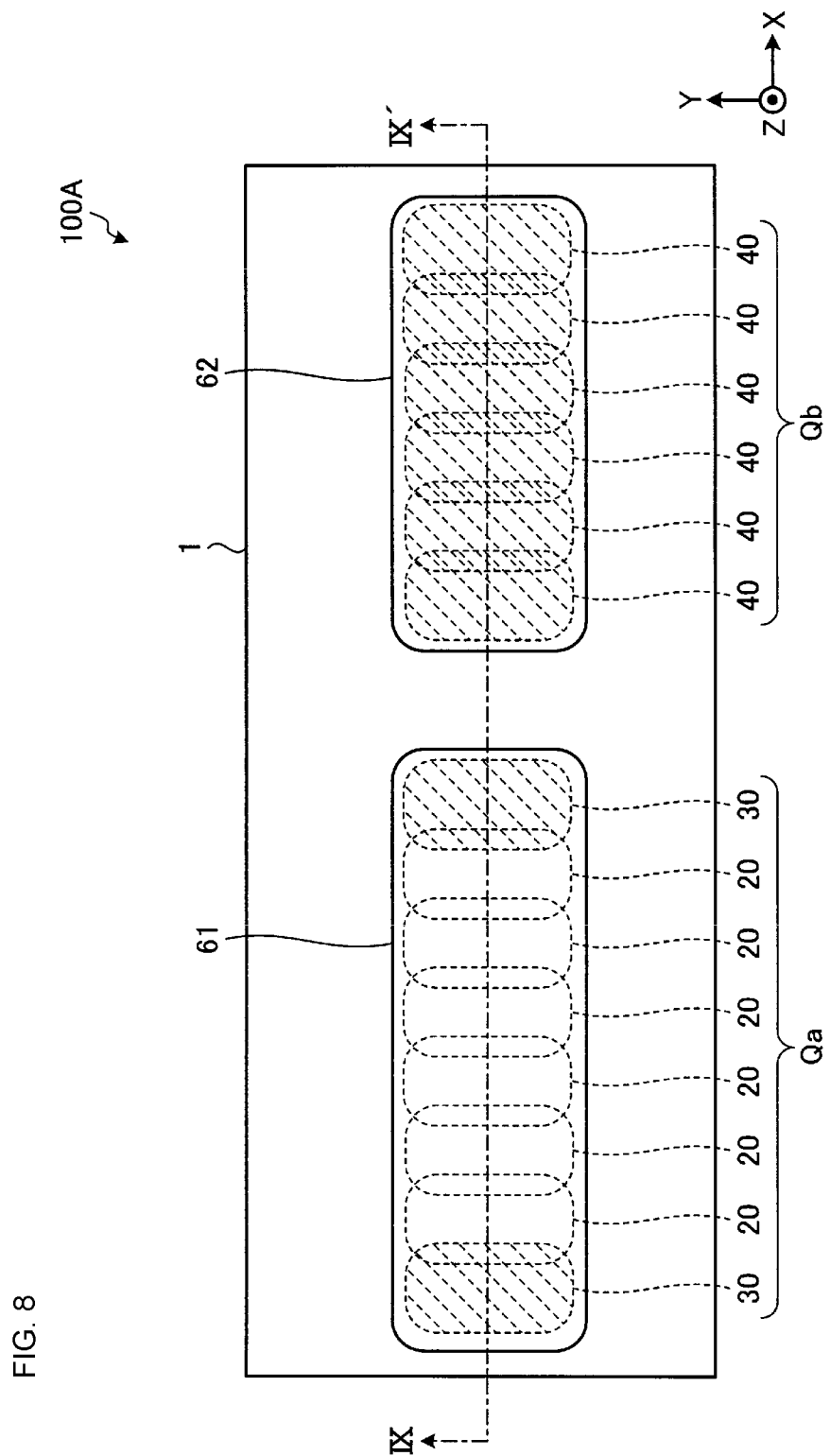
FIG. 8 is a plan view of a semiconductor device according to Variation 1 of Embodiment 1.
Figure 9:
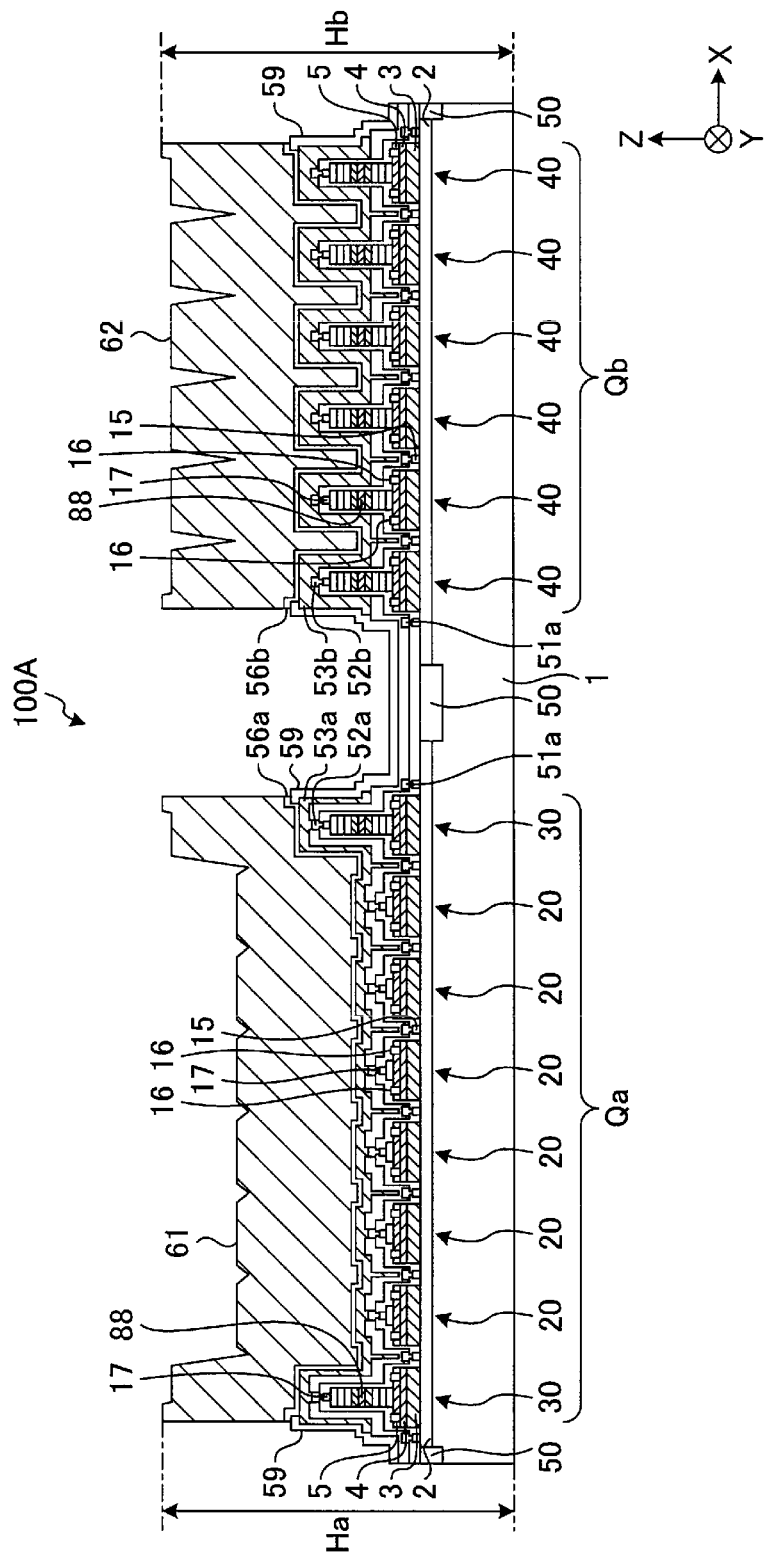
FIG. 9 is a cross-section along line IX-IX' in FIG. 8.
Figure 10:
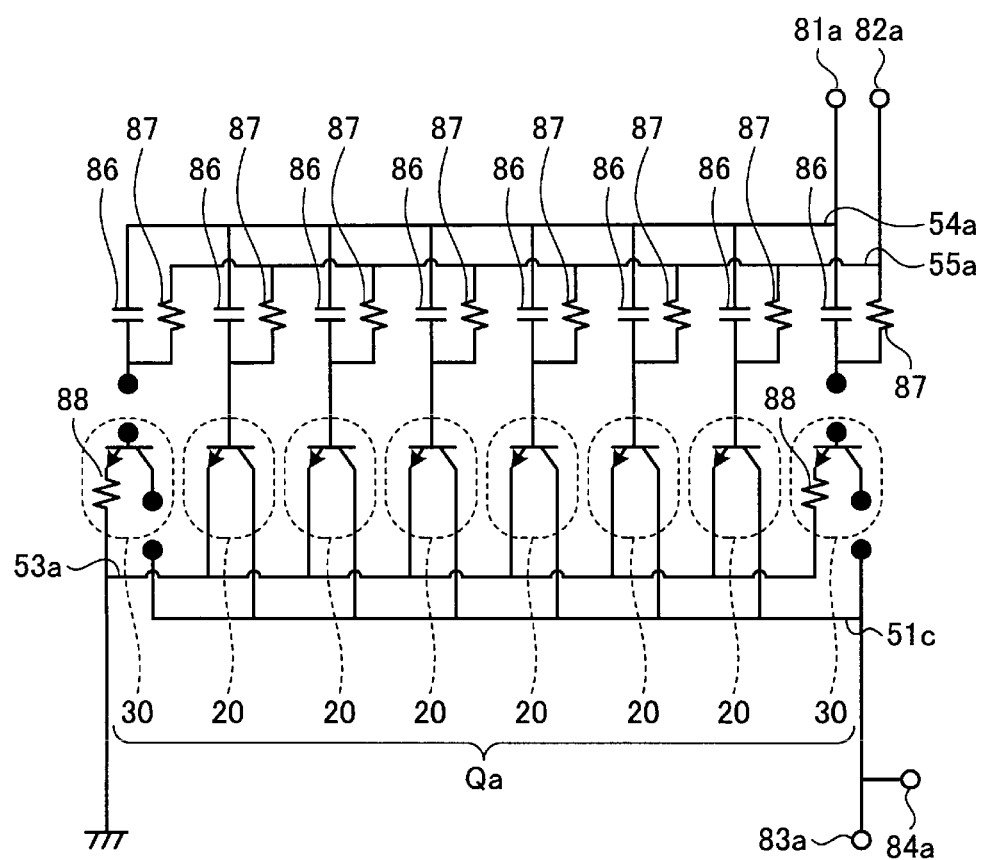
FIG. 10 is an equivalent circuit diagram of a first transistor assembly according to Variation 1 of Embodiment 1.

FIG. 8 is a plan view of a semiconductor device according to Variation 1 of Embodiment 1. FIG. 9 is a cross-section taken line IX-IX' in FIG. 8. FIG. 10 is an equivalent circuit diagram of a first transistor assembly Qa according to Variation 1 of Embodiment 1. In Variation 1 of Embodiment 1, the sequence of the first transistor assembly Qa is different from that in Embodiment 1.

As illustrated in FIGS. 8 and 9, the first transistor assembly Qa of the semiconductor device 100A has six first bipolar transistors 20 and two second bipolar transistors 30. The six first bipolar transistors 20 are between the two second bipolar transistors 30 in X direction. One of the two second bipolar transistors 30 is farther than the first bipolar transistors 20 from the second transistor assembly Qb. The other second bipolar transistor 30 is closer than the first bipolar transistors 20 to the second transistor assembly Qb.

Moreover, as illustrated in FIG. 10, the multiple first bipolar transistors 20 function as transistors by being connected to first base wiring 54a, first base bias wiring 55a, first emitter wiring 53a, and first collector wiring 51c. The bases of the second bipolar transistors 30 are each isolated from the first base wiring 54a and first base bias wiring 55a. The collectors of the second bipolar transistors 30 are each isolated from the first collector wiring 51c. As a result, the second bipolar transistors 30 do not function as transistors.

In this variation, the semiconductor device 100A can be made with a first transistor assembly Qa smaller in size than in Embodiment 1 because it uses fewer second bipolar transistors 30.

Variation 2 of Embodiment 1

Figure 11:
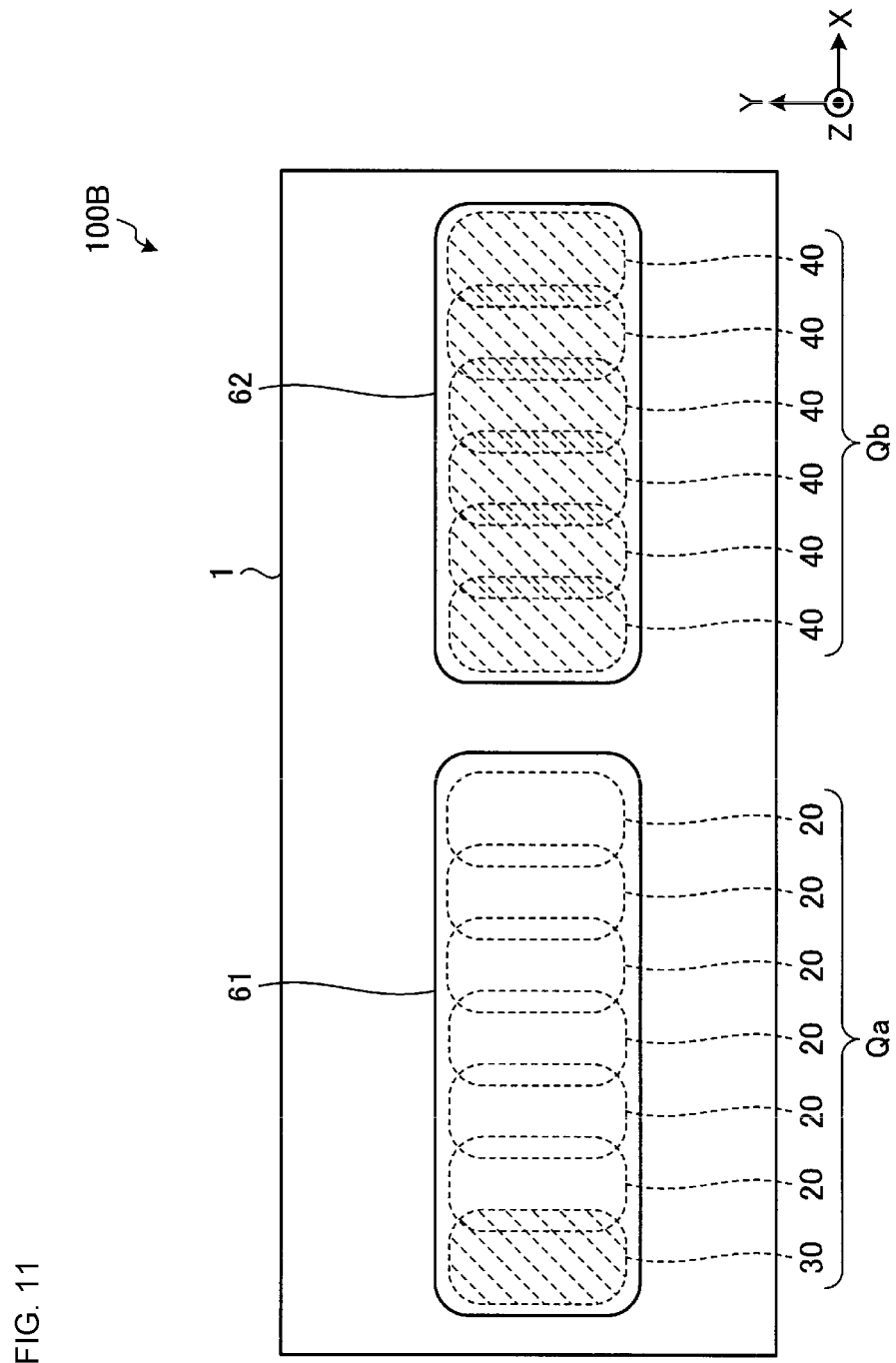
FIG. 11 is a plan view of a semiconductor device according to Variation 2 of Embodiment 1.

FIG. 11 is a plan view of a semiconductor device according to Variation 2 of Embodiment 1. In Variation 2 of Embodiment 1 unlike Embodiment 1, the semiconductor device 100B has one second bipolar transistor 30.

As illustrated in FIG. 11, the second bipolar transistor 30 is farther than the multiple first bipolar transistors 20 from the second transistor assembly Qb in X direction. In other words, the multiple first bipolar transistors 20 are between the second bipolar transistor 30 and third bipolar transistors 40. As can be seen from this, the first transistor assembly Qa is not limited to structures having multiple second bipolar transistors 30 and only needs to have at least one second bipolar transistor 30. In this variation, although with one second bipolar transistor 30, the first maximum height Ha of the semiconductor device 100B remains substantially equal to the second maximum height Hb.

Variation 3 of Embodiment 1

Figure 12:
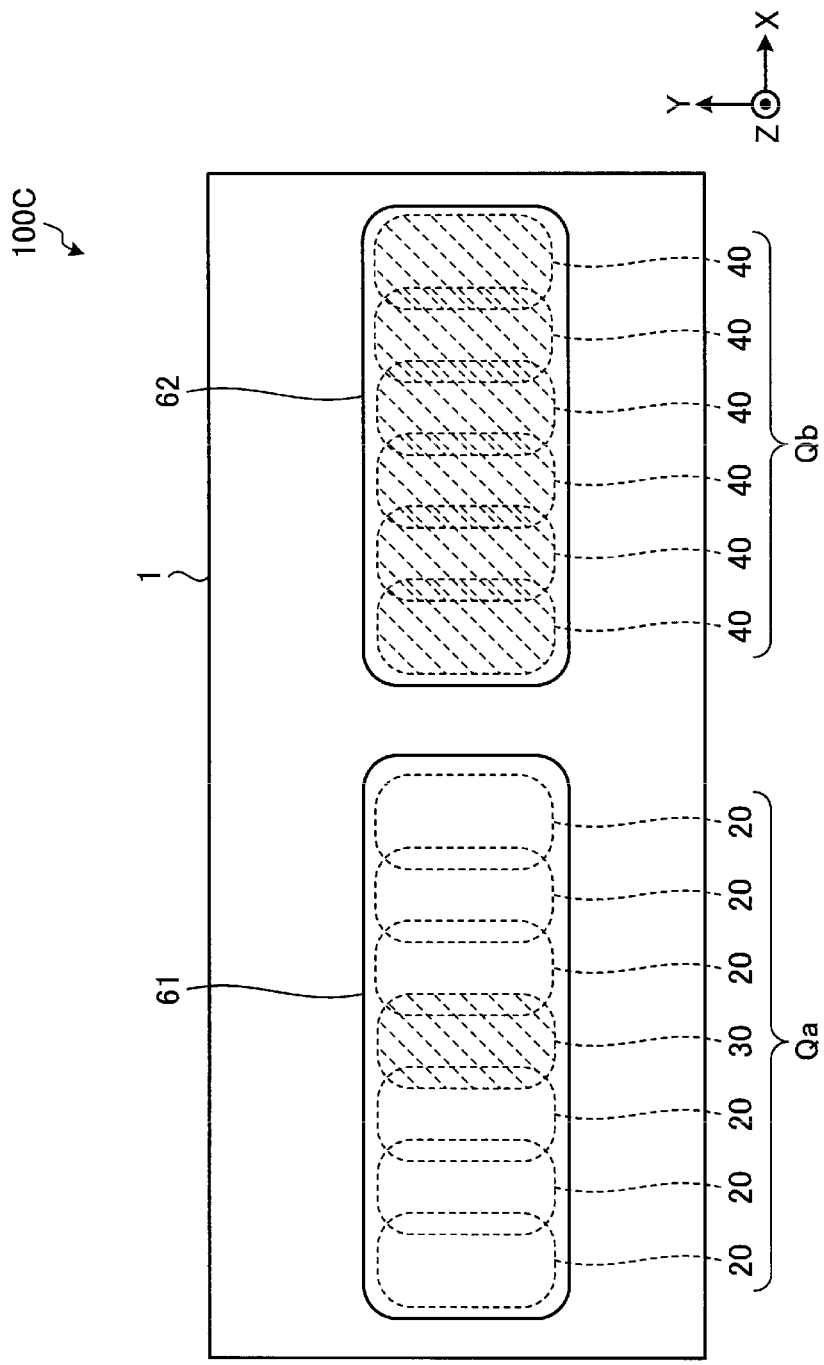
FIG. 12 is a plan view of a semiconductor device according to Variation 3 of Embodiment 1.

FIG. 12 is a plan view of a semiconductor device according to Variation 3 of Embodiment 1. In Variation 3 of Embodiment 1, the position of the one second bipolar transistor 30 is different from that in Variation 2 of Embodiment 1.

As illustrated in FIG. 12, the semiconductor device 100C has the one second bipolar transistor 30 in the middle portion, in X direction, of the first transistor assembly Qa. The second bipolar transistor 30 is between multiple first bipolar transistors 20 and multiple first bipolar transistors 20. There are three first bipolar transistors 20 between the second bipolar transistor 30 and the second transistor assembly Qb. There are three first bipolar transistors 20 positioned farther than the second bipolar transistor 30 from the second transistor assembly Qb.

The number of first bipolar transistors 20 may be different between one side and the other side of the second bipolar transistor 30. Preferably, the number of the first bipolar transistors 20 between the second bipolar transistor 30 and the second transistor assembly Qb is larger than that of the first bipolar transistors 20 positioned farther than the second bipolar transistor 30 from the second transistor assembly Qb. This allows the semiconductor device 100C to be mounted stably on an external substrate by virtue of the increased distance between the second bipolar transistor 30, having the first maximum height Ha, in the first transistor assembly Qa and the second transistor assembly Qb.

Variation 4 of Embodiment 1

Figure 13:
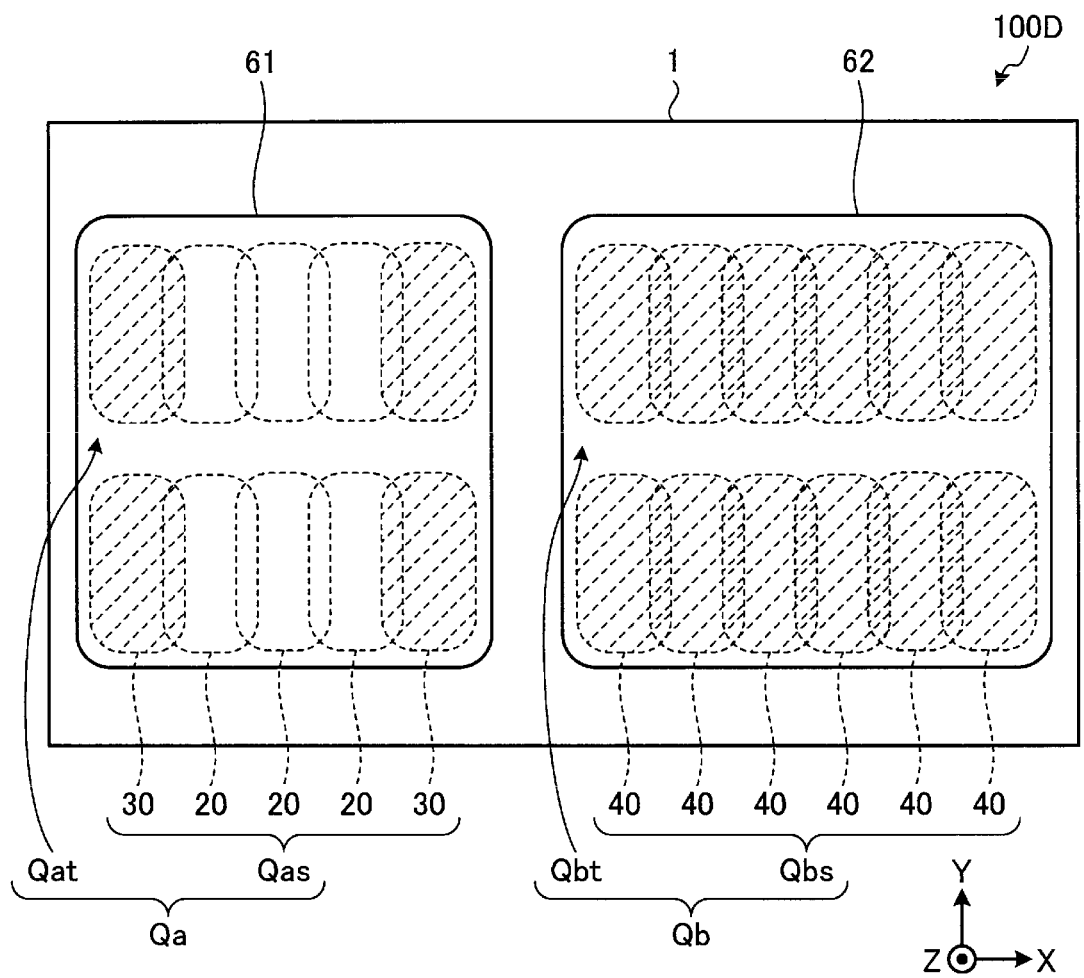
FIG. 13 is a plan view of a semiconductor device according to Variation 4 of Embodiment 1.

FIG. 13 is a plan view of a semiconductor device according to Variation 4 of Embodiment 1. In Variation 4 of Embodiment 1, unlike Embodiment 1, the first and second transistor assemblies Qa and Qb each have multiple rows of transistors.

As illustrated in FIG. 13, the first transistor assembly Qa has a first transistor row Qas and a second transistor row Qat. The first and second transistor rows Qas and Qat are beside each other in Y direction. The first and second transistor rows Qas and Qat each have multiple first and multiple second bipolar transistors 20 and 30 lined up in X direction. Each of the first and second transistor rows Qas and Qat has three first bipolar transistors 20 between two second bipolar transistors 30.

The first bipolar transistors 20 in the first and second transistor rows Qas and Qat are unified into a first transistor assembly Qa by being electrically coupled to shared first emitter wiring 53a, first base wiring Ma, first base bias wiring 55a, and first collector wiring 51c (see FIG. 5). The second bipolar transistors 30 in the first and second transistor rows Qas and Qat all have at least one of their base and collector isolated from the first base wiring 54a, first base bias wiring 55a, and first collector wiring 51c.

The second transistor assembly Qb has a first transistor row Qbs and a second transistor row Qbt. The first and second transistor rows Qbs and Qbt are beside each other in Y direction. The first transistor row Qbs of the second transistor assembly Qb is beside the first transistor row Qas of the first transistor assembly Qa in X direction. The second transistor row Qbt of the second transistor assembly Qb is beside the second transistor row Qat of the first transistor assembly Qa in X direction. The first and second transistor rows Qbs and Qbt each have multiple third bipolar transistors 40 lined up in X direction.

In this variation, the semiconductor device 100D can be made with first and second transistor assemblies Qa and Qb shorter in X direction than in Embodiment 1, even if incorporating as many or more transistors than in Embodiment 1. As a result, the semiconductor device 100D can be made with a semiconductor substrate 1 shorter in X direction than in Embodiment 1.

Variation 5 of Embodiment 1

Figure 14:
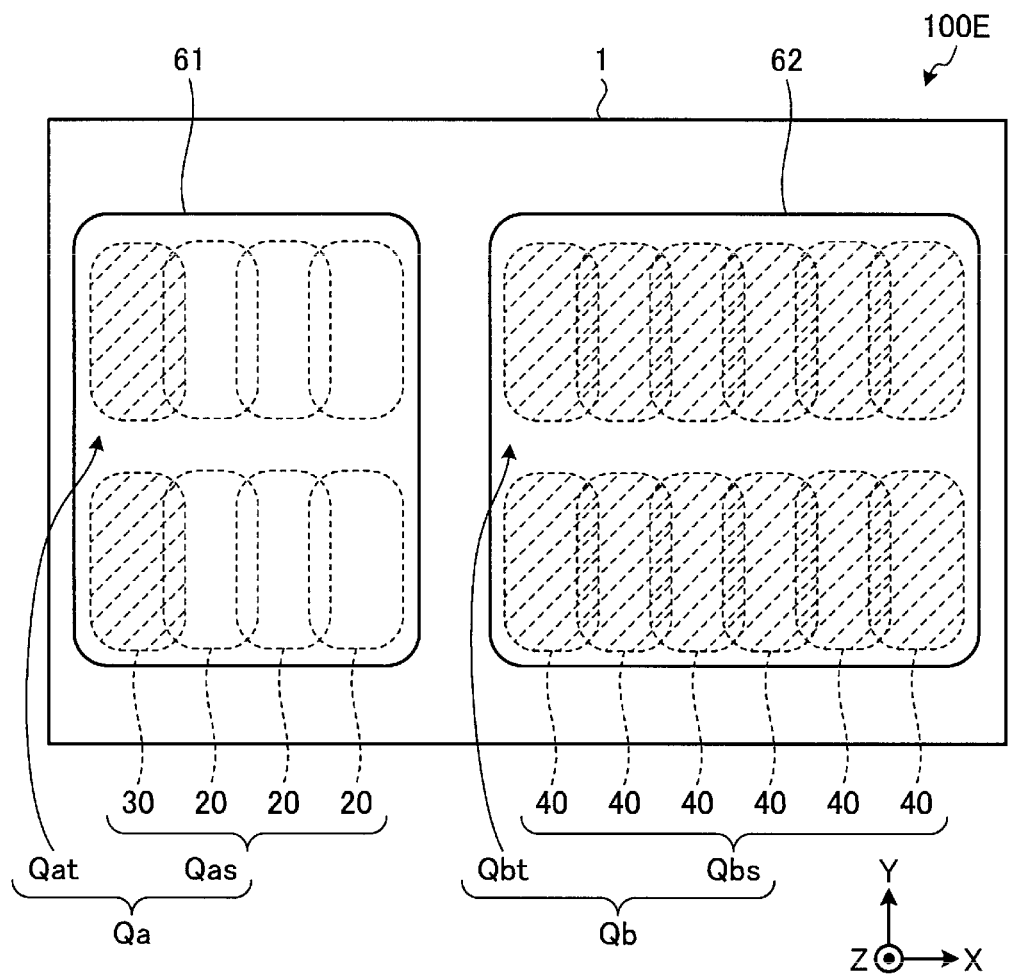
FIG. 14 is a plan view of a semiconductor device according to Variation 5 of Embodiment 1.

FIG. 14 is a plan view of a semiconductor device according to Variation 5 of Embodiment 1. In Variation 5 of Embodiment 1, unlike Variation 4 of Embodiment 1, the first and second transistor rows of Qas and Qat of the first transistor assembly Qa each have one second bipolar transistor 30.

As illustrated in FIG. 14, the first transistor row Qas of the semiconductor device 100E has multiple first bipolar transistors 20 and one second bipolar transistor 30. The second bipolar transistor 30 is farther than the multiple first bipolar transistors 20 from the first transistor row Qbs of the second transistor assembly Qb in X direction. In other words, the multiple first bipolar transistors 20 are between one second bipolar transistor 30 and the first transistor row Qbs of the second transistor assembly Qb in X direction. The second transistor row Qat has the same sequence as the first transistor row Qas. That is, in the first and second transistor rows Qas and Qat, the multiple first bipolar transistors 20 are beside each other in Y direction, with the multiple second bipolar transistors 30 beside each other in Y direction.

Variation 6 of Embodiment 1

Figure 15:
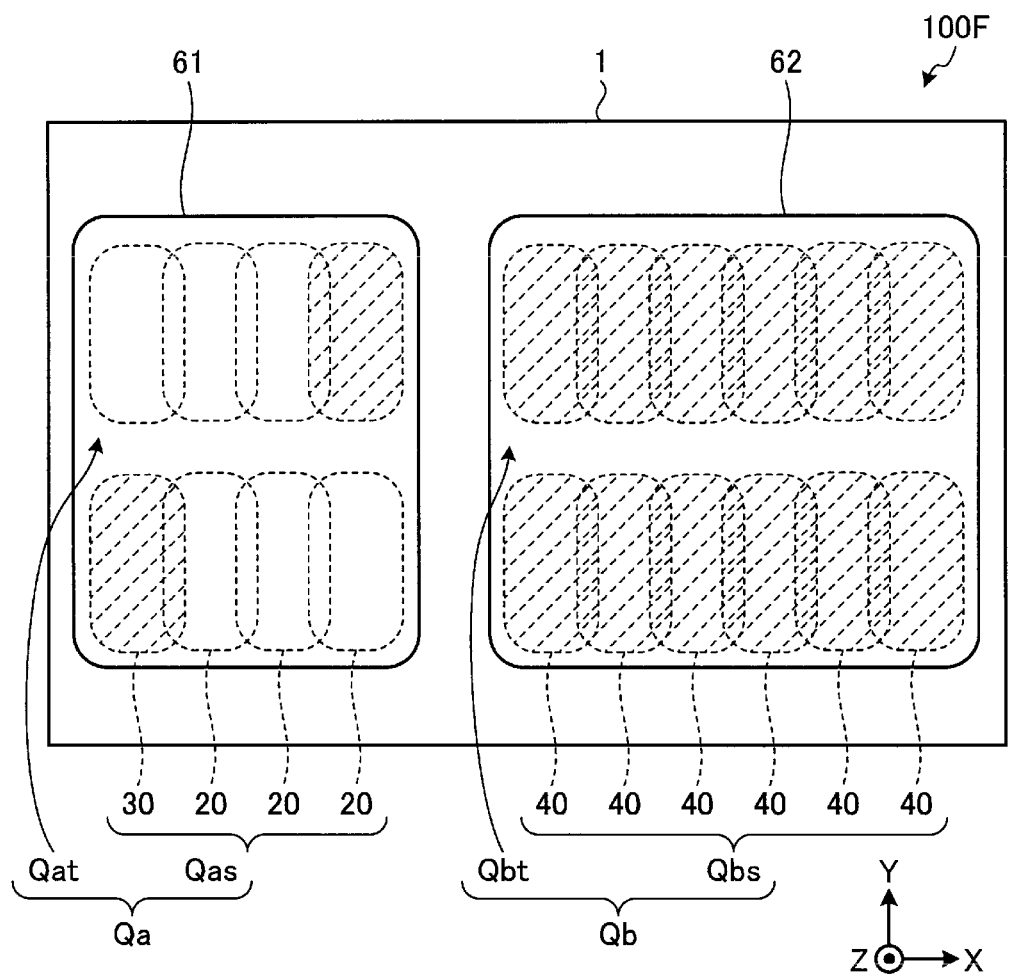
FIG. 15 is a plan view of a semiconductor device according to Variation 6 of Embodiment 1.

FIG. 15 is a plan view of a semiconductor device according to Variation 6 of Embodiment 1. In Variation 6 of Embodiment 1, unlike Variation 5 of Embodiment 1, the first and second transistor rows Qas and Qat of the first transistor assembly Qa have different sequences.

As illustrated in FIG. 15, the first transistor row Qas of the semiconductor device 100F has the same structure as in FIG. 14. In the second transistor row Qat, one second bipolar transistor 30 is closer than multiple first bipolar transistors 20 to the second transistor row Qbt of the second transistor assembly Qb in X direction. In other words, there is one second bipolar transistor 30 between the second transistor row Qbt of the second transistor assembly Qb and multiple first bipolar transistors 20 in X direction. The second bipolar transistors 30 in the first transistor row Qas is beside a first bipolar transistor 20 in the second transistor row Qat in Y direction. The second bipolar transistor 30 in the second transistor row Qat is beside a first bipolar transistor 20 in the first transistor row Qas in Y direction.

As set forth above, the semiconductor devices 100 and 100A to 100F according to this embodiment have a semiconductor substrate 1, multiple first bipolar transistors 20, at least one second bipolar transistor 30, and a first bump 61. The first bipolar transistors 20 are on the first primary surface S1 side of the semiconductor substrate 1 and have a first height HEa between an emitter layer 5 and an emitter electrode 17 in the direction perpendicular to the first primary surface S1. The second bipolar transistor 30 is on the first primary surface S1 side of the semiconductor substrate 1 and has a second height HEb, greater than the first height HEa, between an emitter layer 5 and an emitter electrode 17 in the direction perpendicular to the first primary surface S1. The first bump 61 stretches over the multiple first bipolar transistors 20 and the at least one second bipolar transistor 30.

When the semiconductor device 100 and 100A to 100F are mounted on an external substrate with the first bump 61 facing the external substrate, the first bump 61 is electrically coupled to the external substrate at least where it overlaps the second bipolar transistor 30. As a result, the first bipolar transistors 20, having the first height HEa, are electrically coupled to the external substrate via the first bump 61. In this way, the semiconductor device 100 and 100A to 100F can be mounted on an external substrate with reduced occurrence of poor electrical connection.

Moreover, the semiconductor devices 100 and 100A to 100F according to this embodiment have third bipolar transistors 40 and a second bump 62. The third bipolar transistors 40 are on the first primary surface S1 side of the semiconductor substrate 1 and have the aforementioned second height HEb between an emitter layer 5 and an emitter electrode 17 in the direction perpendicular to the first primary surface S1. The second bump 62 stretches over the multiple third bipolar transistors 40.

The third bipolar transistors 40 have substantially the same maximum height as the second bipolar transistor 30. The semiconductor device 100 and 100A to 100F can be mounted on an external substrate with less frequent occurrence of poor electrical connection than with a first transistor assembly Qa composed only of multiple first bipolar transistors 20 having the first height HEa.

For the semiconductor devices 100 and 100A to 100F according to this embodiment, moreover, the first bipolar transistors 20 are between the second bipolar transistor 30 and the third bipolar transistors 40 in a direction parallel to the first primary surface S1 of the semiconductor substrate 1 (X direction). This allows the semiconductor device 100 and 100A to 100F to be mounted stably on an external substrate by virtue of the increased distance between the second bipolar transistor 30, having the first maximum height Ha, in the first transistor assembly Qa and the third bipolar transistors 40 in the second transistor assembly Qb.

For the semiconductor devices 100 and 100A to 100F according to this embodiment, moreover, the first, second, and third bipolar transistors 20, 30, and 40 are heterojunction bipolar transistors. This makes the transistors in the first and second transistor assemblies Qa and Qb superior in power-added efficiency and linearity as amplifier elements.

For the semiconductor devices 100 and 100A to 100F according to this embodiment, moreover, the first and second bumps 61 and 62 are pillar bumps. When the semiconductor device 100 is mounted on an external substrate by flip chip mounting, this ensures good connection is achieved between connection pads on the external substrate and the pillar bumps.

For the semiconductor devices 100 and 100A to 100F according to this embodiment, moreover, the third bipolar transistors 40 have a resistor layer (emitter ballast resistor 88) between the emitter layer 5 and the emitter electrode 17. This means the first transistor assembly Qa is formed by first bipolar transistors 20 having no resistor layer, and the second transistor assembly Qb is formed by third bipolar transistors 40 having a resistor layer. By virtue of its capability to switch the transistors to operate, between the first and second transistor assemblies Qa and Qb, depending on the collector voltage, the semiconductor device 100 and 100A to 100F maintain a high power-added efficiency whether the output power is low or high.

For the semiconductor devices 100 and 100A to 100F according to this embodiment, moreover, the second bipolar transistor 30 has a resistor layer (emitter ballast resistor 88) between the emitter layer 5 and the emitter electrode 17. This allows the first maximum height Ha, of the first transistor assembly Qa, to be substantially equal to the second maximum height Hb, of the second transistor assembly Qb.

For the semiconductor devices 100 and 100A to 100F according to this embodiment, moreover, the resistor layer (emitter ballast resistor 88) of the second and third bipolar transistors 30 and 40 is primarily AlGaAs. This allows the resistor layer of the third bipolar transistors 40 to be formed with a desired resistance value. Furthermore, the second and third bipolar transistors 30 and 40 can be formed with substantially equal second height HEb because the resistor layer of the second bipolar transistor 30 and that of the third bipolar transistors 40 can be formed in the same step.

For the semiconductor devices 100 and 100A to 100F according to this embodiment, moreover, the base electrodes 16 of the multiple first bipolar transistors 20 are each electrically coupled to shared first base wiring 54a. The collector electrodes 15 of the multiple first bipolar transistors 20 are each electrically coupled to shared first collector wiring 51c. The base electrodes 16 and/or the collector electrodes 15 of the second bipolar transistor 30 are isolated from the first base wiring 54a and first collector wiring 51c. This leads to, in the first transistor assembly Qa, the multiple first bipolar transistors 20 functioning as transistors and the second bipolar transistor 30 not.

For the semiconductor devices 100 and 100A to 100F according to this embodiment, furthermore, the emitter electrode 17 of the multiple first bipolar transistors 20 and that of the second bipolar transistor 30 are electrically coupled to shared first emitter wiring 53a. The emitter electrode 17 of the multiple third bipolar transistors 40 is electrically coupled to shared second emitter wiring 53b. The first bump 61 extends above the first emitter wiring 53a along the first emitter wiring 53a. The second bump 62 extends above the second emitter wiring 53b along the second emitter wiring 53b.

This gives the first bump 61 irregularities corresponding to the first height HEa, of the first bipolar transistors 20, and the second height HEb, of the second bipolar transistor 30. The portion of the first bump 61 under which the second bipolar transistor 30 is present determines the first maximum height Ha. As a result, the first maximum height Ha, of the first transistor assembly Qa, and the second maximum height Hb, of the second transistor assembly Qb, are substantially equal.

Embodiment 2

Figure 16:
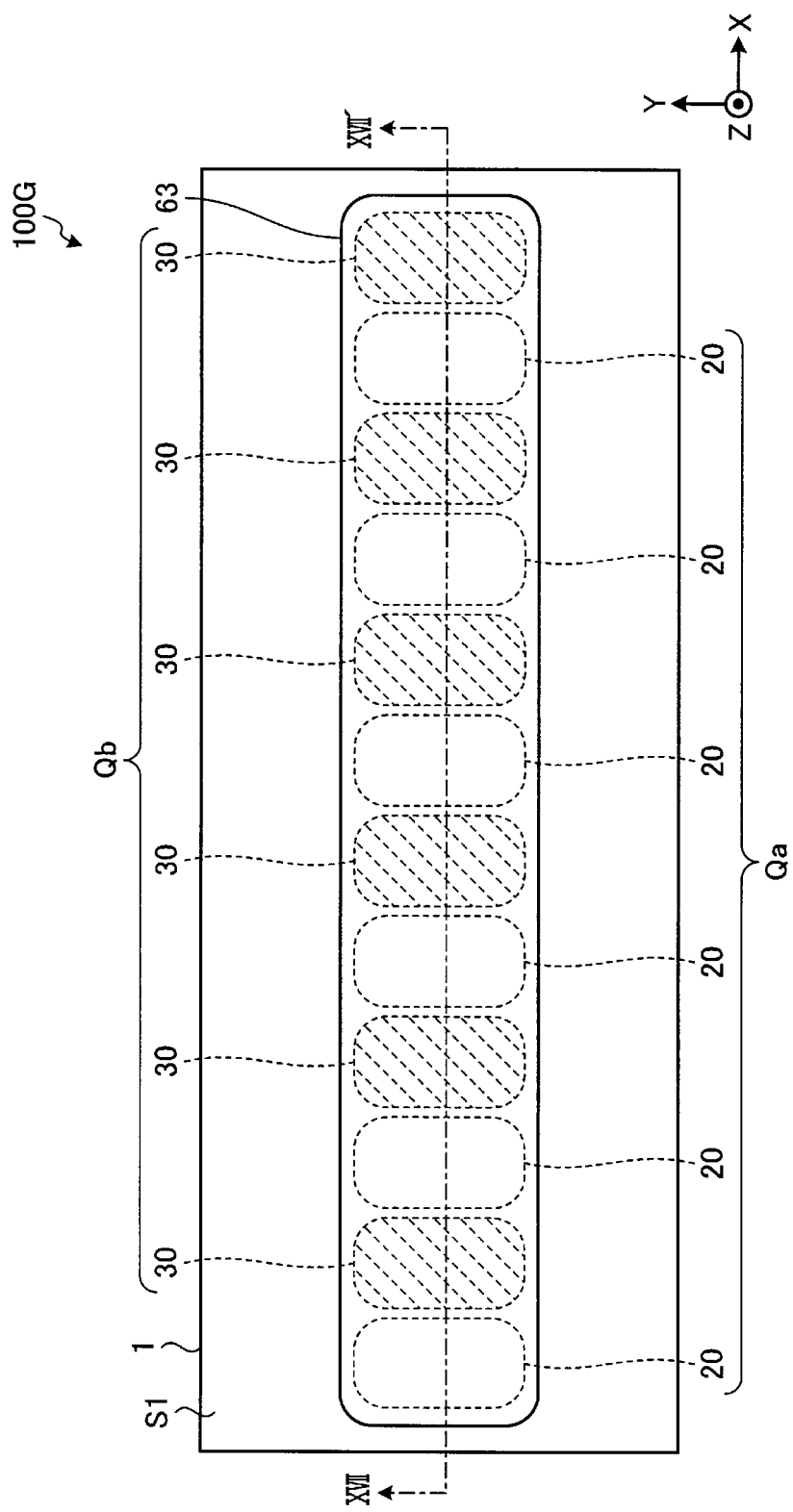
FIG. 16 is a plan view of a semiconductor device according to Embodiment 2.
Figure 17:
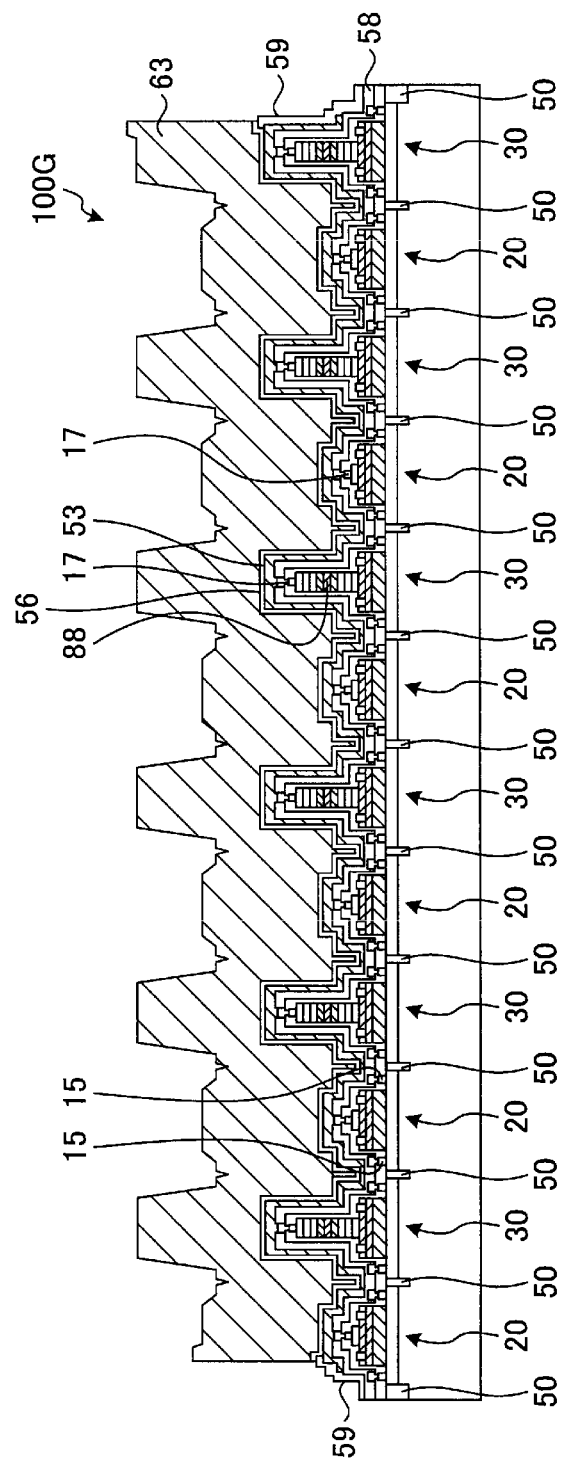
FIG. 17 is a cross-section along line XVII-XVII' in FIG. 16.
Figure 18:
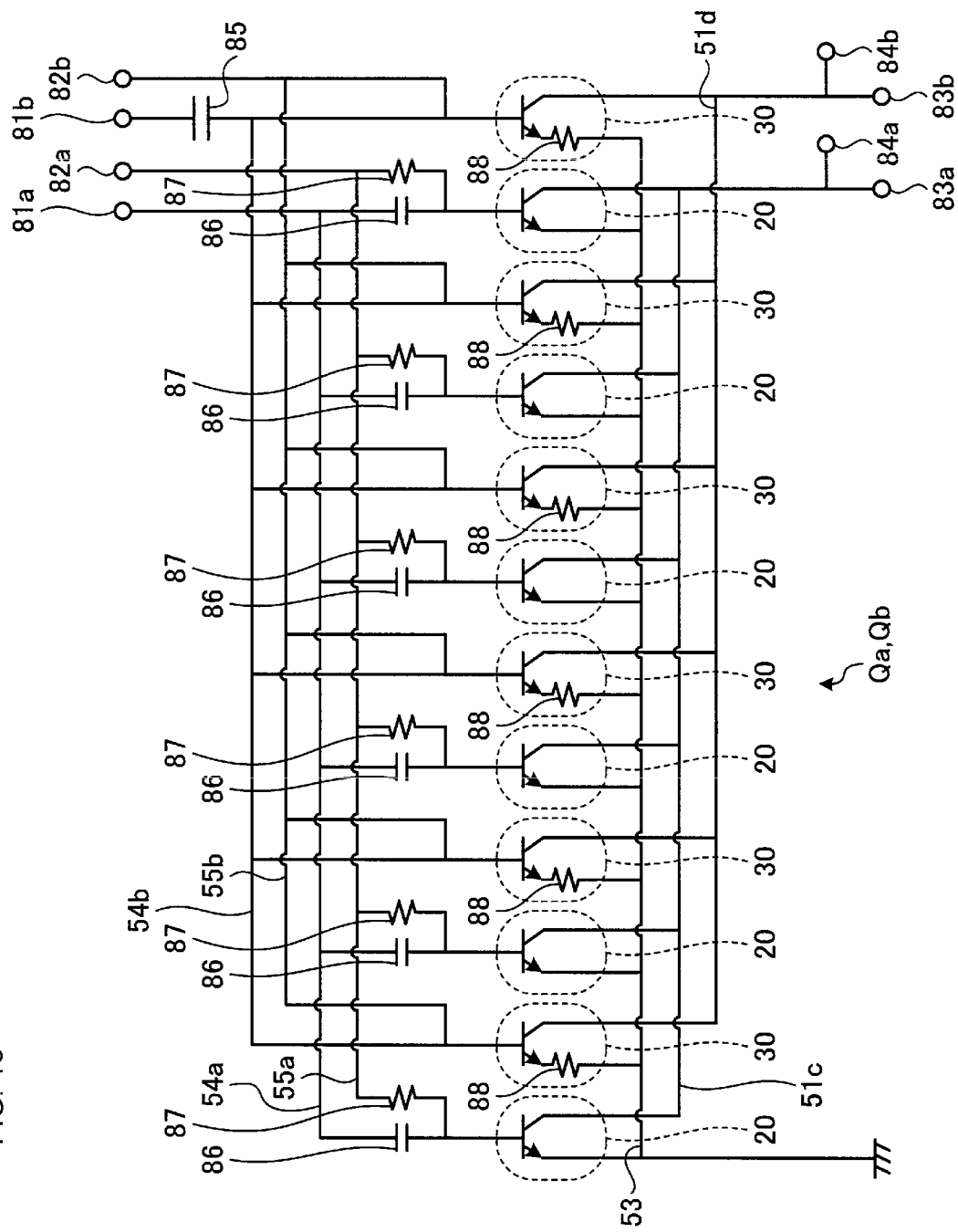
FIG. 18 is an equivalent circuit diagram of a semiconductor device according to Embodiment 2.

FIG. 16 is a plan view of a semiconductor device according to Embodiment 2. FIG. 17 is a cross-section along line XVII-XVII' in FIG. 16. FIG. 18 is an equivalent circuit diagram of a semiconductor device according to Embodiment 2. In Embodiment 2, unlike Embodiment 1, there is one bump 63 over the first and second transistor assemblies Qa and Qb.

As illustrated in FIG. 16, multiple first bipolar transistors 20 and multiple second bipolar transistors 30 alternate in X direction, a direction parallel to the first primary surface S1 of the semiconductor substrate 1. The first transistor assembly Qa has multiple first bipolar transistors 20. The second transistor assembly Qb has multiple second bipolar transistors 30.

As illustrated in FIG. 17, emitter wiring 53, a lower metal layer 56, and a bump 63 stretch over the multiple first and multiple second bipolar transistors 20 and 30. The emitter wiring 53 is electrically coupled to the emitter electrode 17 of the multiple first bipolar transistors 20 and that of the multiple second bipolar transistors 30. The lower metal layer 56 is on the emitter wiring 53. The bump 63 is on the lower metal layer 56. The bump 63 extends above the emitter wiring 53 along the emitter wiring 53.

There are isolation regions 50 each lying between a first bipolar transistor 20 and a second bipolar transistor 30. Each of the first and second bipolar transistors 20 and 30 has its own collector electrodes 15. That is, the collector electrodes 15 are not shared by a first bipolar transistor 20 and a second bipolar transistor 30.

As illustrated in FIG. 18, each emitter (emitter electrode 17) of the first bipolar transistors 20 and each emitter (emitter electrode 17) of the second bipolar transistors 30 are connected to shared emitter wiring 53 and grounded.

In the first transistor assembly Qa, each base (base electrodes 16) of the multiple first bipolar transistors 20 is connected to shared first base wiring 54a via a capacitance 86. Moreover, each base (base electrodes 16) of the first bipolar transistors 20 is connected to shared first base bias wiring 55a via a base ballast resistor 87. Each collector (collector electrodes 15) of the first bipolar transistors 20 is connected to shared first collector wiring 51c.

In the second transistor assembly Qb, each base (base electrodes 16) of the multiple second bipolar transistors 30 is connected to shared second base wiring 54b. The second base wiring 54b is connected to a base high-frequency input terminal 81b via a capacitance 85. Each base (base electrodes 16) of the second bipolar transistors 30 is also connected to shared second base bias wiring 55b. Each collector (collector electrodes 15) of the second bipolar transistors 30 is connected to shared second collector wiring 51d.

In such a configuration, the multiple first bipolar transistors 20 forming the first transistor assembly Qa amplify a high-frequency signal input from a base high-frequency input terminal 81a and output the amplified signal to a collector high-frequency output terminal 83a. The second bipolar transistors 30, forming the second transistor assembly Qb, amplify a high-frequency signal input from the base high-frequency input terminal 81b and output the amplified signal to a collector high-frequency output terminal 83b.

As set forth above, the semiconductor device 100G according to this embodiment has alternating multiple first bipolar transistors 20, forming a first transistor assembly Qa, and multiple second bipolar transistors 30, forming a second transistor assembly Qb. A shared bump 63 stretches over the multiple first and multiple second bipolar transistors 20 and 30.

The semiconductor device 100G according to this embodiment has the highest surface of the bump 63 above the first transistor assembly Qa and that above the second transistor assembly Qb at different heights from the second primary surface S2. Even in this case, the semiconductor device 100G can be mounted on an external substrate with reduced occurrence of poor electrical connection because the shared bump 63 guarantees electrical coupling of the first and second transistor assemblies Qa and Qb to the external substrate via the shared bump 63.

Embodiment 3

Figure 19:
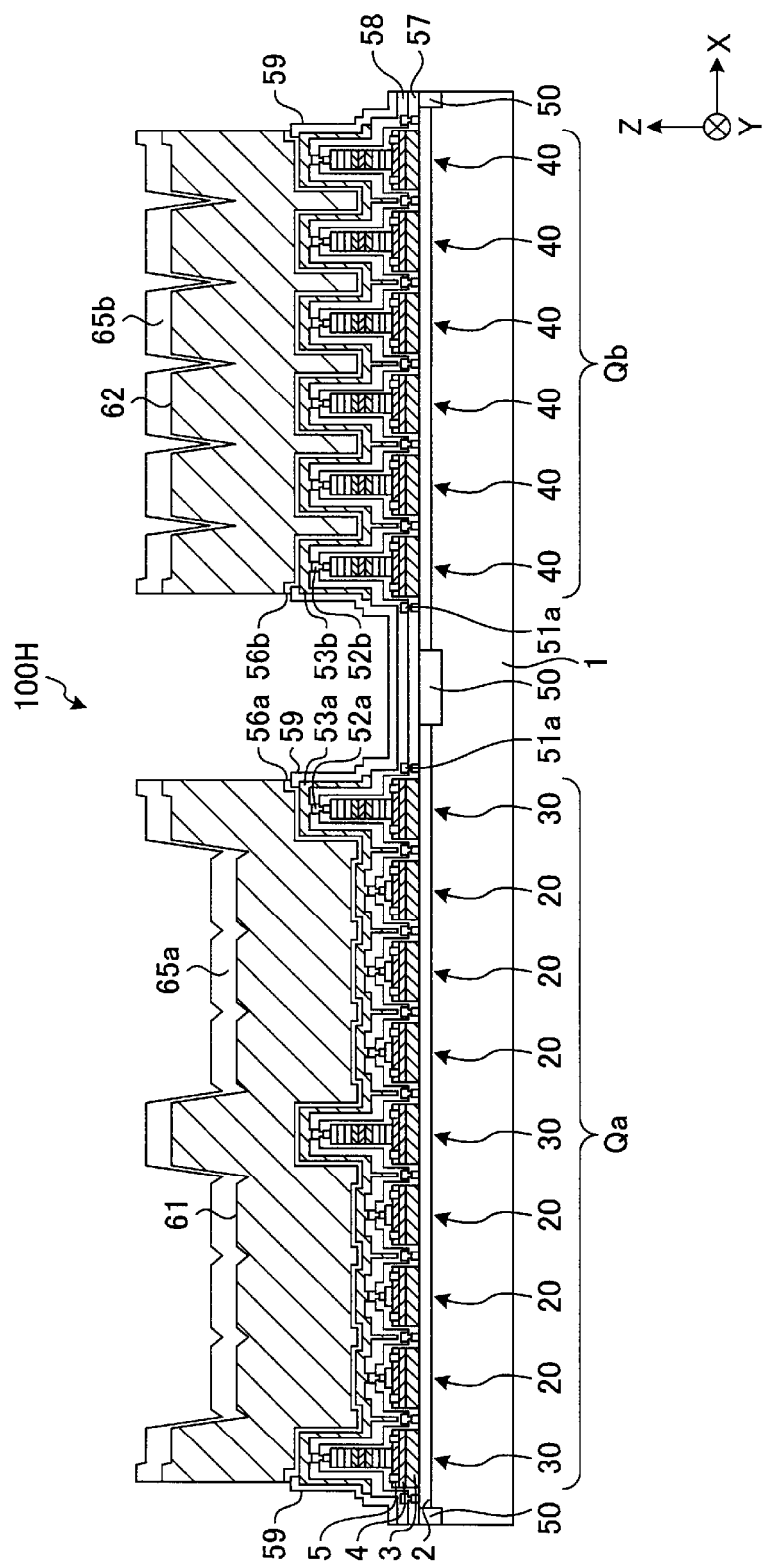
FIG. 19 is a cross-section of a semiconductor device according to Embodiment 3.

FIG. 19 is a cross-section of a semiconductor device according to Embodiment 3. In Embodiment 3, unlike Embodiments 1 and 2, the first and second bumps 61 and 62 are covered with solder layers 65a and 65b, respectively.

As illustrated in FIG. 19, there is a solder layer 65a on the first bump 61, stretching over multiple first and multiple second bipolar transistors 20 and 30. There is a solder layer 65b on the second bump 62, stretching over multiple third bipolar transistors 40. When the semiconductor device 100H is mounted on an external substrate, therefore, the solder layers 65a and 65b come into contact with connection pads on the external substrate. Then the first and second bumps 61 and 62 are joined to the connection pads using the solder layers 65a and 65b, for example by reflow soldering.

The configuration in this embodiment can also be applied to the semiconductor devices 100 and 100A to 100G according to Embodiments 1 and 2.

Embodiment 4

Figure 20:
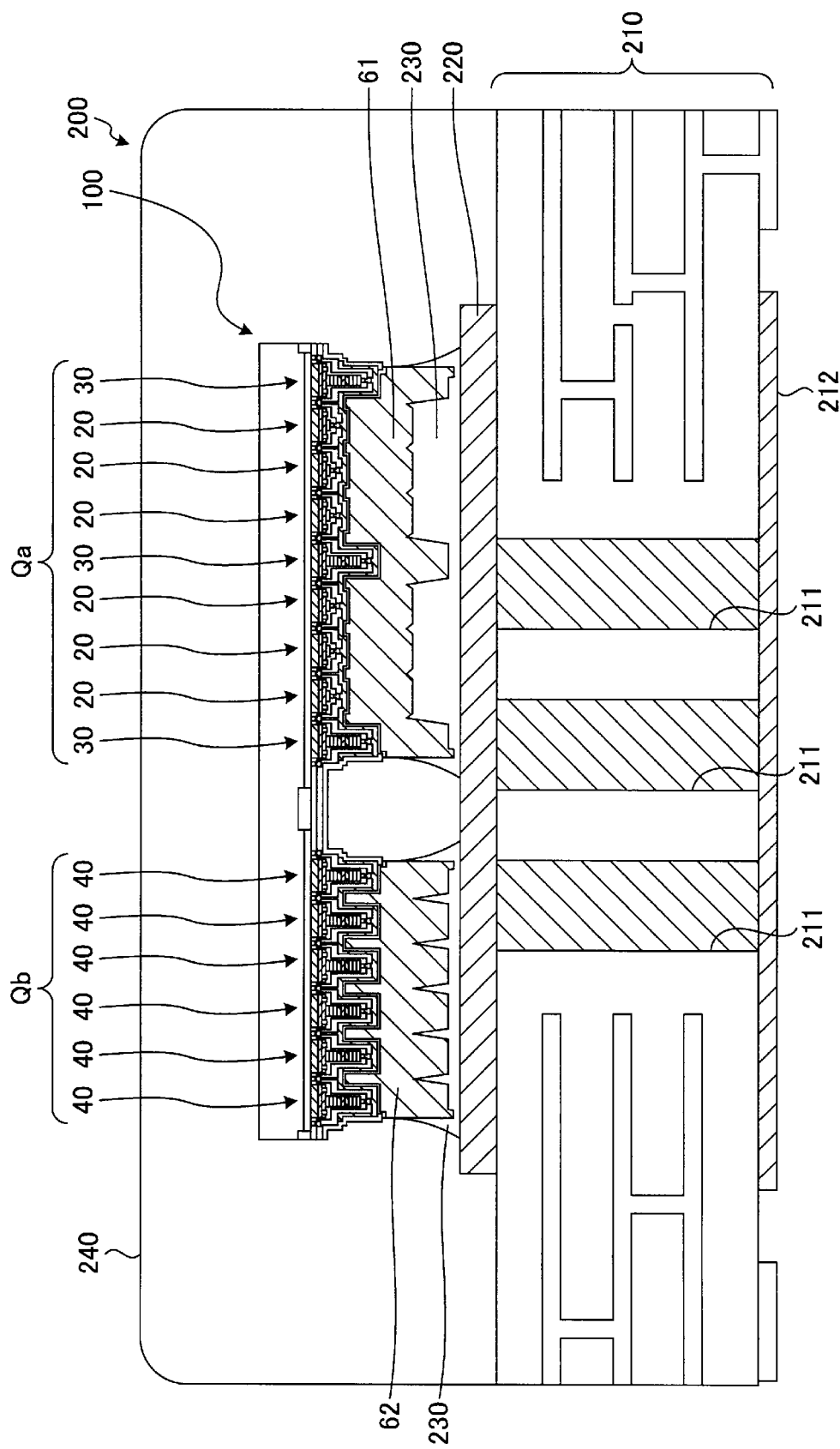
FIG. 20 is a cross-section of a power-amplifier module according to Embodiment 4.
Figure 21:
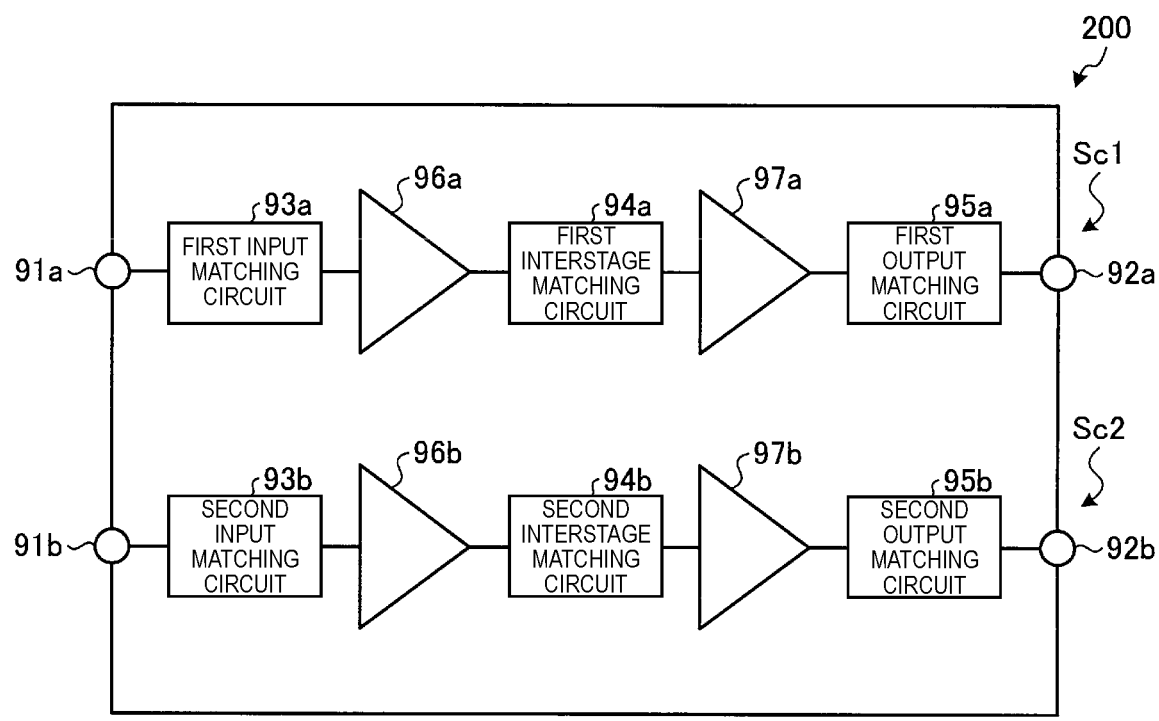
FIG. 21 is a block diagram illustrating the structure of a power-amplifier module according to Embodiment 4.

FIG. 20 is a cross-section of a power-amplifier module according to Embodiment 4. FIG. 21 is a block diagram illustrating the structure of a power-amplifier module according to Embodiment 4. The power-amplifier module 200 has a module substrate 210, a semiconductor device 100, and a resin layer 240.

The module substrate 210 has a first pad 220, through vias 211, a second pad 212, and wiring and other components formed between or through the substrate inner layers. The first pad 220 is a terminal for the mounting of the semiconductor device 100. The second pad 212 is a terminal to which a reference potential is applied. The first and second pads 220 and 212 are connected together by multiple through vias 211.

The semiconductor device 100 is mounted on the module substrate 210 by flip chip mounting. The first and second bumps 61 and 62 are each connected to the first pad 220 with solder 230 interposed. As a result, each bipolar transistor in the first and second transistor assemblies Qa and Qb is electrically coupled to the module substrate 210. The resin layer 240 extends on the module substrate 210, covering the semiconductor device 100.

As illustrated in FIG. 21, the power-amplifier module 200 has a first signal chain Sc1 and a second signal chain Sc2.

The first signal chain Sc1 is a path for a first high-frequency signal to pass through and has a first input terminal 91a, a first input matching circuit 93a, a first initial-stage amplifier circuit 96a, a first interstage matching circuit 94a, a first output-stage amplifier circuit 97a, a first output matching circuit 95a, and a first output terminal 92a. The first input matching circuit 93a is a circuit that provides impedance matching on the input side of the first initial-stage amplifier circuit 96a. The first interstage matching circuit 94a is a circuit that provides impedance matching between the output side of the first initial-stage amplifier circuit 96a and the input side of the first output-stage amplifier circuit 97a. The first output matching circuit 95a is a circuit that provides impedance matching on the output side of the first output-stage amplifier circuit 97a. The first input, first interstage, and first output matching circuits 93a, 94a, and 95a are each formed by, for example, a capacitor and an inductor. The first initial-stage and first output stage amplifier circuits 96a and 97a are each formed by, for example, the first transistor assembly Qa of the semiconductor device 100. The first high-frequency signal is input from the first input terminal 91a, amplified through the matching and amplifier circuits, and output from the first output terminal 92a.

The second signal chain Sc2 is a path for a second high-frequency signal to pass through and has a second input terminal 91b, a second input matching circuit 93b, a second initial-stage amplifier circuit 96b, a second interstage matching circuit 94b, a second output-stage amplifier circuit 97b, a second output matching circuit 95b, and a second output terminal 92b. The second input, second interstage, and second output matching circuits 93b, 94b, and 95b are circuits having a function similar to that of the first input, first interstage, and first output matching circuits 93a, 94a, and 95a. The second initial-stage and second output stage amplifier circuits 96b and 97b are each formed by, for example, the second transistor assembly Qb of the semiconductor device 100. The second high-frequency signal is input from the second input terminal 91b, amplified through the matching and amplifier circuits, and output from the second output terminal 92b.

The first and second signal chains Sc1 and Sc2 do not become electrically active simultaneously but operate in a time-division manner. That is, while the first signal chain Sc1 is electrically active, the second signal chain Sc2 is electrically inactive. While the second signal chain Sc2 is electrically active, the first signal chain Sc1 is electrically inactive. This allows the power-amplifier module 200 to maintain a good power-added efficiency by operating the first or second signal chain Sc1 or Sc2 depending on whether the output power is low or high.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a semiconductor substrate;
a plurality of first bipolar transistors on a first primary surface side of the semiconductor substrate;
at least one second bipolar transistor on the first primary surface side of the semiconductor substrate;
a first bump stretching over the plurality of first bipolar transistors and the at least one second bipolar transistor;
a plurality of third bipolar transistors on the first primary surface side of the semiconductor substrate; and
a second bump stretching over the plurality of third bipolar transistors,
wherein
the plurality of first bipolar transistors have a first height between a bottom surface of the semiconductor substrate of the plurality of first bipolar transistors and a top of the first bump in a direction perpendicular to the first primary surface,
the at least one second bipolar transistor has a second height between a bottom surface of the semiconductor substrate of the at least one second bipolar transistor and the top of the first bump in the direction perpendicular to the first primary surface;
the second height is greater than the first height;
the plurality of third bipolar transistors have a third height between a bottom surface of the semiconductor substrate of the plurality of third bipolar transistors and a top of a second bump in the direction perpendicular to the first primary surface, and
the third height is greater than the first height.

2. The semiconductor device according to claim 1, wherein
the plurality of first bipolar transistors are between the at least one second bipolar transistor and the plurality of third bipolar transistors in a direction parallel to the first primary surface of the semiconductor substrate.

3. The semiconductor device according to claim 2, wherein
the plurality of third bipolar transistors are heterojunction bipolar transistors.

4. The semiconductor device according to claim 2, wherein
the second bump is a pillar bump.

5. The semiconductor device according to claim 2, wherein
the plurality of third bipolar transistors have a resistor layer between an emitter layer and an emitter electrode.

6. The semiconductor device according to claim 2, wherein
base electrodes of the plurality of first bipolar transistors are each electrically coupled to shared first base wiring, and collector electrodes of the plurality of first bipolar transistors are each electrically coupled to shared first collector wiring; and
at least one of a base electrode and a collector electrode of the at least one second bipolar transistor is isolated from the first base wiring and the first collector wiring.

7. The semiconductor device according to claim 2, wherein
an emitter electrode of the plurality of first bipolar transistors and of the at least one second bipolar transistor is electrically coupled to shared first emitter wiring;
an emitter electrode of the plurality of third bipolar transistors is electrically coupled to shared second emitter wiring;

the first bump extends above the first emitter wiring along the first emitter wiring; and the second bump extends above the second emitter wiring along the second emitter wiring.

8. The semiconductor device according to claim 1, wherein the plurality of third bipolar transistors are heterojunction bipolar transistors.

9. The semiconductor device according to claim 1, wherein the second bump is a pillar bump.

10. The semiconductor device according to claim 1, wherein the plurality of third bipolar transistors have a resistor layer between an emitter layer and an emitter electrode.

11. The semiconductor device according to claim 10, wherein the resistor layer of the plurality of third bipolar transistors is primarily AlGaAs.

12. The semiconductor device according to claim 1, wherein base electrodes of the plurality of first bipolar transistors are each electrically coupled to shared first base wiring, and collector electrodes of the plurality of first bipolar transistors are each electrically coupled to shared first collector wiring; and at least one of a base electrode and a collector electrode of the at least one second bipolar transistor is isolated from the first base wiring and the first collector wiring.

13. The semiconductor device according to claim 1, wherein an emitter electrode of the plurality of first bipolar transistors and of the at least one second bipolar transistor is electrically coupled to shared first emitter wiring;

an emitter electrode of the plurality of third bipolar transistors is electrically coupled to shared second emitter wiring;

the first bump extends above the first emitter wiring along the first emitter wiring; and the second bump extends above the second emitter wiring along the second emitter wiring.

14. A semiconductor device comprising:

a semiconductor substrate;

a plurality of first bipolar transistors on a first primary surface side of the semiconductor substrate;

at least one second bipolar transistor on the first primary surface side of the semiconductor substrate; and a first bump stretching over the plurality of first bipolar transistors and the at least one second bipolar transistor, wherein the at least one second bipolar transistor is a plurality of second bipolar transistors;

the plurality of first bipolar transistors and the plurality of second bipolar transistors alternate in a direction parallel to the first primary surface of the semiconductor substrate;

the plurality of first bipolar transistors have a first height between a bottom surface of the semiconductor substrate of the plurality of first bipolar transistors and a top of the first bump in a direction perpendicular to the first primary surface;

the plurality of second bipolar transistors have a second height between a bottom surface of the semiconductor substrate of the plurality of second bipolar transistor and the top of the first bump in the direction perpendicular to the first primary surface;

the second height is greater than the first height;

base electrodes of the plurality of first bipolar transistors are each electrically coupled to shared first base wiring, and collector electrodes of the plurality of first bipolar transistors are each electrically coupled to shared first collector wiring; and base electrodes of the plurality of second bipolar transistors are each electrically coupled to shared second base wiring, and collector electrodes of the plurality of second bipolar transistors are each electrically coupled to shared second collector wiring.

15. The semiconductor device according to claim 1, wherein the plurality of first bipolar transistors and the at least one second bipolar transistor are heterojunction bipolar transistors.

16. The semiconductor device according to claim 1, wherein the first bump is a pillar bump.

17. The semiconductor device according to claim 1, wherein the at least one second bipolar transistor has a resistor layer between an emitter layer and an emitter electrode.

18. The semiconductor device according to claim 17, wherein the resistor layer of the at least one second bipolar transistor is primarily AlGaAs.

* * * * *